(12) United States Patent
Yamamoto et al.

(10) Patent No.: US 8,018,577 B2
(45) Date of Patent: Sep. 13, 2011

(54) ILLUMINATION-SENSOR CALIBRATION METHODS, AND EXPOSURE METHODS AND APPARATUS AND DEVICE-MANUFACTURING METHODS INCLUDING SAME, AND REFLECTIVE MASKS USED IN SAME

(75) Inventors: Hajime Yamamoto, Kumagaya (JP); Tohru Isogami, Tsukuba (JP); Kazuaki Suzuki, Tokyo (JP); Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 567 days.

(21) Appl. No.: 11/437,595

(22) Filed: May 19, 2006

(65) Prior Publication Data

US 2006/0290916 A1 Dec. 28, 2006

(30) Foreign Application Priority Data

May 23, 2005 (JP) .................................. 2005-148944
Apr. 12, 2006 (JP) .................................. 2006-109578

(51) Int. Cl.
*G03B 27/54* (2006.01)
(52) U.S. Cl. ......................................................... 355/67
(58) Field of Classification Search ............... 250/492.2; 355/53, 67, 68, 69; 430/5
See application file for complete search history.

(56) References Cited

U.S. PATENT DOCUMENTS

| 5,728,495 | A | * | 3/1998 | Ozawa | ............................ | 430/30 |
| 6,115,107 | A | * | 9/2000 | Nishi | ............................... | 355/68 |
| 6,359,678 | B1 | * | 3/2002 | Ota | ................................... | 355/53 |
| 6,406,820 | B1 | | 6/2002 | Ota | | |
| 2002/0081501 | A1 | * | 6/2002 | Hasegawa et al. | ............... | 430/5 |
| 2003/0090644 | A1 | * | 5/2003 | Nei | ................................... | 355/69 |
| 2003/0142410 | A1 | * | 7/2003 | Miyake | ......................... | 359/619 |
| 2005/0110972 | A1 | | 5/2005 | Tsuji et al. | | |
| 2006/0001856 | A1 | * | 1/2006 | Moors et al. | ..................... | 355/69 |

FOREIGN PATENT DOCUMENTS

JP 2000-286190 10/2000

* cited by examiner

*Primary Examiner* — Hung Henry Nguyen
*Assistant Examiner* — Steven H Whitesell-Gordon
(74) *Attorney, Agent, or Firm* — Klarquist Sparkman, LLP

(57) ABSTRACT

Exposure apparatus are disclosed that can control, to high precision, exposure doses on a photosensitive substrate of a mask pattern defined on a reflective mask as the pattern is being exposed on the substrate using a projection-optical system. An exemplary apparatus includes a first illumination sensor for detecting light that is incident on a reflective mask from an illumination system and a second illumination sensor for detecting light that has propagated from the illumination system to a reference reflective surface on the reflective mask, reflected from the reference reflective surface, and arrived at an image surface of the projection-optical system. Calibration of the first sensor is performed based on detection data obtained by the first sensor and detection data obtained by the second sensor. Exposure of the substrate is controlled based on the detection data obtained by the calibrated first sensor.

36 Claims, 14 Drawing Sheets

ILLUMINATION-SENSOR CALIBRATION METHODS, AND EXPOSURE METHODS AND APPARATUS AND DEVICE-MANUFACTURING METHODS INCLUDING SAME, AND REFLECTIVE MASKS USED IN SAME

CROSS REFERENCE TO RELATED APPLICATIONS

This application corresponds to, and claims priority under 35 U.S.C. §119 to, Japan Patent Application Nos. JP 2005-148944, filed on May 23, 2005, and JP 2006-109578, filed on Apr. 12, 2006, both incorporated herein by reference.

FIELD

This disclosure relates to calibration methods for an illumination sensor, to exposure methods and exposure apparatus including use of such a sensor, to device-manufacturing methods including exposure, and to reflective masks used in exposure. More specifically, the disclosure relates to exposure-dose control in a lithographic exposure apparatus in which a circuit pattern on a reflective mask is transferred to a photosensitive substrate using EUV light (light with wavelengths of 5 to 30 nm, also called "soft X-rays").

BACKGROUND

In a lithographic exposure apparatus used in the manufacture of semiconductor elements or the like, a circuit pattern formed on a mask (reticle) is transferred onto a photosensitive substrate (a wafer, for example) using a projection-optical system. A resist is coated on the photosensitive substrate, the resist is exposed using the projection-optical system, and a resist pattern corresponding to the mask pattern is produced. In the exposure apparatus, it is necessary to control the exposure dose on the photosensitive substrate. However, because the exposure dose on the photosensitive substrate cannot be measured in real time, a portion of the illumination light radiated on the mask is measured in real time, and exposure-dose control is performed based on these measurement results. Because the beam passed through the mask varies depending on the pattern ratio of the mask, it is difficult to control exposure dose by measuring the quantity of light passing through the mask. Consequently, an illumination sensor is placed so as to measure a portion of the illumination light discharged from the light source and impinging on the mask.

For example, in an exposure apparatus that uses EUV (Extreme Ultraviolet) light as the exposure light, the technology for controlling exposure dose is disclosed in Japan Patent Document No. Hei 09-184900-JP.

SUMMARY

For high-precision control of exposure dose based on the output of an illumination sensor, the relationship between the intensity of illumination light incident on a mask with the intensity of exposure light incident on a photosensitive substrate must be determined as needed and the illumination sensor calibrated accordingly. Whenever a transparent mask is used, the illumination sensor is calibrated while the mask is removed from the optical path. However, whenever a reflective mask is used, as in an EUVL (extreme ultraviolet lithography) exposure apparatus, the illumination light cannot reach the surface of the photosensitive substrate if the mask is removed, which prevents this calibration from being performed.

In order to calibrate the illumination sensor, Applicants studied a method in which a reference reflector (reference reflective surface) was placed on the mask stage on which the reflective mask is mounted. The intensity of light reflected by the reference reflector and reaching the image surface of the projection-optical system was measured. However, the reflectance of a reference reflector disposed on the mask stage progressively decreases as a result of dust (carbon contamination and the like) adhering to the reference reflector, oxidation of the reflective surface of the reflector, and so forth. Also, if the reflectance of the reflective mask actually used for making exposures is different from the reflectance of the reference reflector disposed on the mask stage, it is difficult to calibrate with high precision the illumination sensor using the reference reflector on the mask stage, and hence it is difficult to control the exposure dose on the photosensitive substrate with high precision.

The present invention was derived in view of the problems summarized above. The invention provides, among other things, exposure apparatus and exposure methods that allow high-precision control of exposure dose on a photosensitive substrate whenever exposure of the substrate is performed from a reflective mask pattern using a projection-optical system.

According to a first aspect, calibration methods are provided for calibrating an illumination sensor used for detecting light incident on a reflective mask from an illumination system. The illumination sensor is used in an exposure apparatus for exposing a reflective mask pattern on a photosensitive substrate using a projection-optical system. An embodiment of the calibration method comprises a first detection step, a second detection step, and a calibration step. In the first detection step light from the illumination system that is incident on the reflective mask is detected using the illumination sensor. In the second detection step light is detected that has propagated from the illumination system to the reference reflective surface, reflected from the reference reflective surface, and arrived at the image surface of the projection-optical system. In the calibration step the illumination sensor is calibrated based on detection data obtained in the first detection step and detection data obtained in the second detection step.

According to a second aspect, methods are provided for exposing a reflective mask pattern, illuminated by an illumination system, onto a photosensitive substrate using a projection-optical system. An embodiment of the method comprises a first detection step, a second detection step, a calibration step, and an exposure-dose control step. In the first detection step light from the illumination system that is incident on the reflective mask is detected using an illumination sensor. In the second detection step light is detected that has propagated from the illumination system to the reference reflective surface, reflected from the reference reflective surface, and arrived at the image surface of the projection-optical system. In the calibration step the illumination sensor is calibrated based on detection data obtained in the first detection step and detection data obtained in the second detection step. In the exposure-dose control step the intensity of exposure light irradiating the photosensitive substrate is controlled based on detection data provided by the illumination sensor as calibrated in the calibration step.

According to a third aspect, exposure apparatus are provided for exposing a reflective mask pattern, illuminated by an illumination system, onto a photosensitive substrate using a projection-optical system. An embodiment of the apparatus comprises a first illumination sensor, a second illumination sensor, a calibration unit, and an exposure-dose control unit. The first illumination sensor detects the illumination light incident on the reflective mask from the illumination system. The second illumination sensor detects light that has propagated from the illumination system, reflected from the reference reflective surface, and arrived at the image surface of the projection-optical system. The calibration unit calibrates the first illumination sensor based on detection data obtained by the first illumination sensor and detection data obtained by the second illumination sensor. The exposure-dose control unit controls the intensity of exposure light irradiating the photosensitive substrate based on the detection data from the first illumination sensor as calibrated by the calibration unit.

According to a fourth aspect, device-manufacturing methods are provided. An embodiment of the method comprises an exposure step and a development step. In the exposure step the pattern on the reflective mask is exposed onto the photosensitive substrate using an exposure method according to the second aspect. In the development step, the exposed photosensitive substrate is developed.

According to a fifth aspect, a reflective mask is provided that is used in an apparatus for exposing a photosensitive substrate using a projection-optical system. An embodiment of such a mask comprises a reference reflective surface for use in controlling the exposure dose, on the photosensitive substrate, of the beam reflected by the reflective surface of the pattern area of the mask. The pattern area is the region on the mask in which the pattern to be transferred to the photosensitive substrate is established.

DETAILED DESCRIPTION

Representative embodiments are described below with reference to the drawings.

Figure 1:
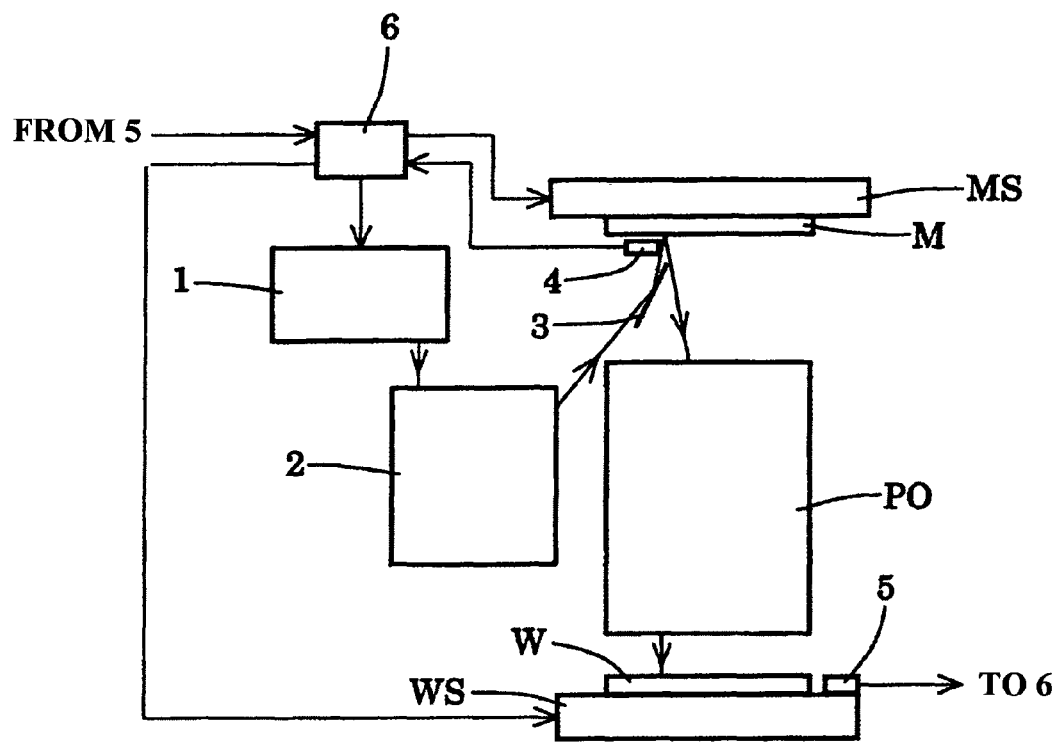
FIG. 1 is a schematic drawing showing the configuration of the exposure apparatus according to an embodiment.
Figure 2:
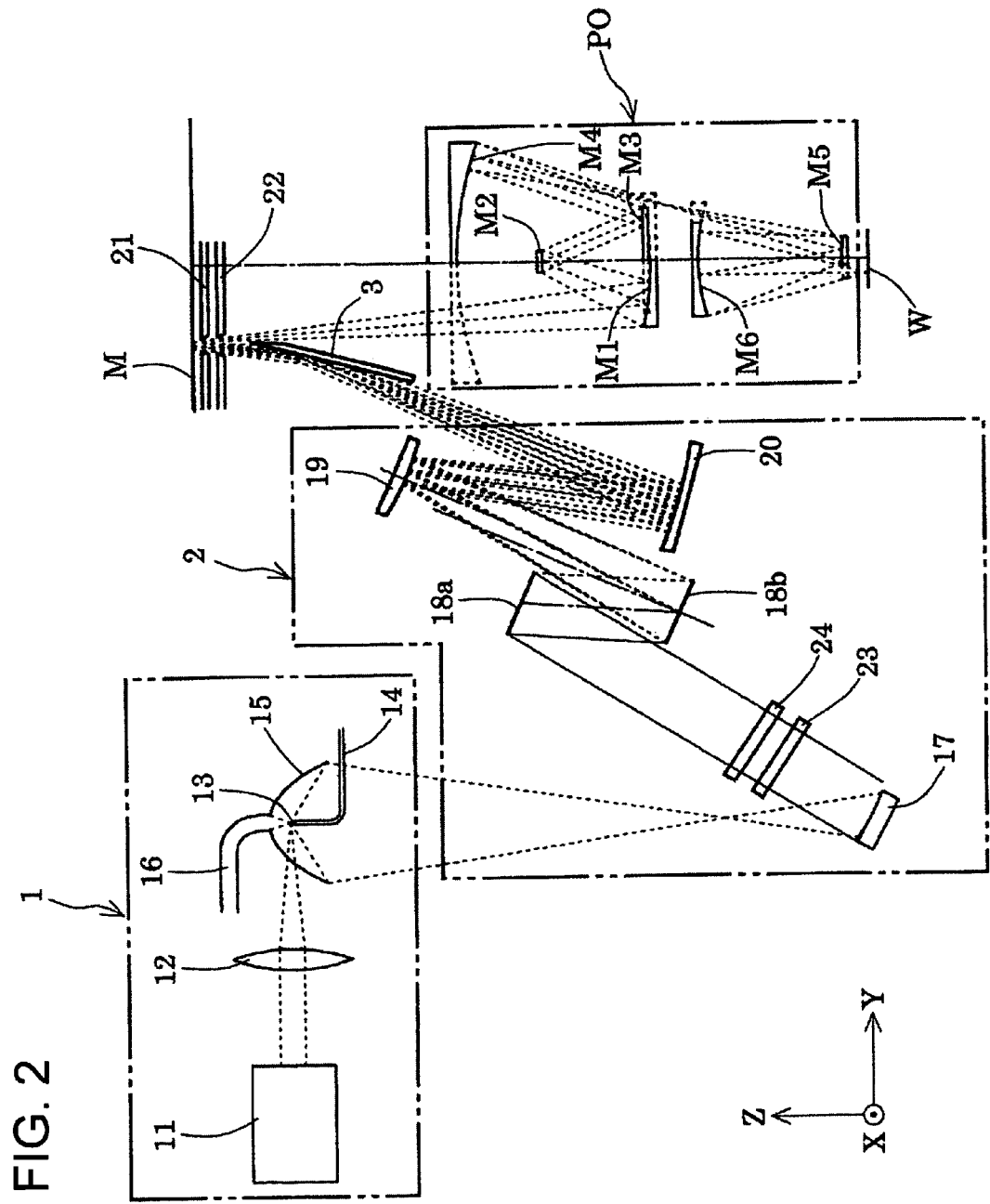
FIG. 2 is a schematic drawing showing the internal configuration of the light source, illumination-optical system, and projection-optical system of the exposure apparatus of FIG. 1.

FIG. 1 is a schematic drawing showing an embodiment of an exposure apparatus, and FIG. 2 is a schematic drawing showing the internal configuration of the light source, illumination-optical system, and projection-optical system of the apparatus of FIG. 1. In FIG. 1, the Z axis is established in the direction of the optical axis of the projection-optical system, namely the direction normal to the wafer which is the photosensitive substrate. The Y axis is established in the wafer surface, parallel to the surface of the page of FIG. 1, and the X axis is established in the wafer surface, perpendicular to the surface of the page of FIG. 1.

With reference to FIG. 1, the exposure apparatus includes an EUV light source 1. The light source 1 produces a beam of EUV light of a predetermined wavelength that is used as exposure light. The beam from the light source 1 enters the illumination-optical system 2. After passing through the illumination-optical system 2, the EUV light is reflected by a flat reflector 3 and illuminates the reflective mask (reticle) M on which the pattern to be transferred is formed. As shown in FIG. 2, an attenuation filter 23 is provided for varying the quantity of exposure light. Also, a wavelength-selecting filter 24 is provided for selectively transmitting EUV light of predetermined wavelengths (for example, 13.4 nm or 11.5 nm). The attenuation filter 23 and wavelength-selecting filter 24 are situated between the light source 1 and mask M.

The mask M is held by the mask stage MS, which is movable in the Y direction, so that the pattern surface of the mask extends in the XY plane. Movement of the mask stage MS is measured by a laser interferometer (not shown). EUV light from the illuminated mask M forms an image of the mask pattern on the wafer W (which is the photosensitive substrate) using a double-imaging, reflective, projection-optical system PO. Specifically, as discussed below with reference to FIG. 3, the exposed region formed on the wafer W at any particular instant is an arc-shaped static exposure region (effective exposure region) that is symmetrical about its Y axis.

The wafer W is held by a wafer stage (substrate stage) WS, which is movable in at least two dimensions in the X and Y directions, so that the exposed surface thereof extends in the XY plane. Movement of the wafer stage WS is measured by a laser interferometer (not shown), like the mask stage MS. The pattern on the mask M is usually exposed onto each of multiple rectangular exposure regions ("shot regions" or "dies") on the wafer W. Exposure of each shot region is performed in a scanning manner in which the mask stage MS and wafer stage WS move synchronously in the Y direction (scanning direction). Thus, during exposure, the mask M and wafer W are caused to move in the Y direction by their respective stages, relative to the projection-optical system PO.

The respective movement velocities of the wafer stage WS and mask stage MS during exposure are proportional to each other, depending upon the projection power of the projection-optical system PO. For example, if the magnification ratio of the projection-optical system PO is 1/4, the movement velocity of the wafer stage WS during exposure is 1/4 the movement velocity of the mask stage MS, thereby allowing synchronized scanning of the stages during exposure. Also during exposure, the pattern on the mask M is sequentially transferred to each shot region of the wafer W by repeating the scanning exposure while causing the wafer stage WS to move two-dimensionally step-wise in the XY plane.

With reference to FIG. 2, light (non-EUV light) emitted by a laser light source 11 is focused on a gas target 13 by a condenser 12 in the laser plasma light source 1. A high-pressure gas comprising xenon (Xe), for example, is supplied by a nozzle 14, and the gas discharged from the nozzle 14 forms the gas target 13. The gas target 13 is energized by the focused laser light and becomes a plasma that emits EUV light. The gas target 13 is situated at a first focal point of an elliptical reflector 15, which focuses the EUV light radiated from the laser plasma light source 1 at a second focal point of the elliptical reflector 15. Meanwhile, the spent gas (that has already emitted light) is aspirated by a duct 16 and delivered outside the system.

The EUV light focused at the second focal point of the elliptical reflector 15 is formed into a substantially parallel beam by a concave reflector 17. The beam is directed to an optical integrator 18 comprising a pair of fly-eye mirrors 18a, 18b. The fly-eye mirrors 18a, 18b each comprise multiple concave mirror elements each having an arc-shaped outer profile, for example, arrayed vertically and horizontally in a closely packed manner. Details of the configuration and operation of the fly-eye mirrors 18a, 18b can be found in U.S. Pat. No. 6,452,661, incorporated herein by reference.

A substantial-extended light source, having a predetermined form, is formed in the vicinity of the reflective surface of the second fly-eye mirror 18b, namely at the exit surface of the optical integrator 18 (18a, 18b). The substantial-extended light source is formed at or in the vicinity of the exit-pupil position of the illumination-optical system 2, namely at or near a surface that is optically conjugate to the entrance pupil of the projection-optical system PO. The beam from the substantial-extended light source is directed from the illumination-optical system 2 by a condensing optical system comprising a convex reflector 19 and a concave reflector 20.

The beam from the illumination-optical system 2 is reflected by the flat reflector 3 and forms an arc-shaped illuminated region on the mask M by a movable blind 21 and a fixed blind 22. The arc-shaped illuminated region corresponds to the arc-shaped static exposure region formed on the wafer W, and has an arc-shaped outer profile that is symmetrical about the Y axis. Thus, the light source 1 (items 11-16), the illumination-optical system 2 (items 17-20), the flat reflector 3, and the blind unit (items 21-22) comprise the illumination-optical system that provides Koehler illumination of the mask M on which a predetermined pattern is established.

The EUV light from the illuminated mask M forms a corresponding image of the illuminated region of the mask in the arc-shaped static exposure region on the wafer W by the projection-optical system PO. The projection-optical system PO comprises a first reflective imaging optical system for forming an intermediate image of the pattern on the mask M, and a second reflective imaging optical system for forming an image (secondary image of the pattern on the mask M) on the wafer W of the intermediate image of the mask pattern. The first reflective imaging optical system comprises four reflectors M1-M4, and the second reflective imaging optical system comprises two reflectors M5-M6. The projection-optical system PO is a telecentric optical system on the wafer side (image side).

Figure 3:
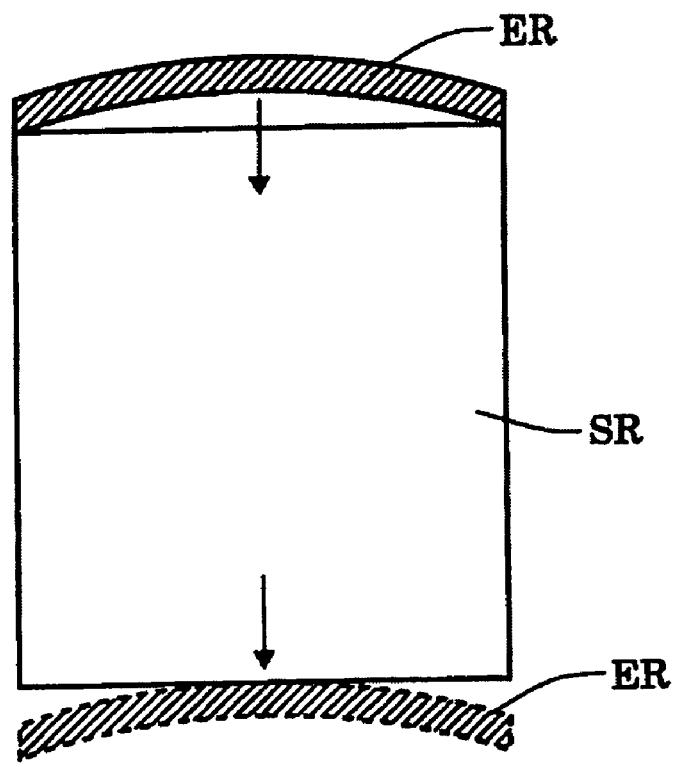
FIG. 3 is a schematic drawing depicting an embodiment of a scanning exposure process.
Figure 3:
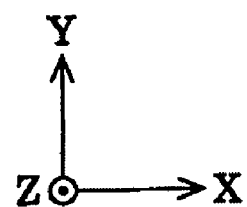

FIG. 3 schematically depicts one scanning-exposure operation performed by the instant embodiment. At the time of the first scanning exposure, the pattern of the mask M is transferred to the rectangular "shot region" (exposure region) SR on the wafer W by the relative movement of the arc-shaped static exposure region (effective exposure region) ER, which is symmetrical about the Y axis. Movement of the arc-shaped static exposure region starts at the initial scanning position, shown with a solid line, and proceeds to the final scanning position, shown with a dashed line. The fixed blind 22 is placed in a fixed manner approximately parallel to and near the mask M, and defines the arc-shaped boundary of the illuminated region formed on the mask M and the arc-shaped boundary of the static exposure region ER formed on the wafer W.

The movable blind 21 is situated further from the mask M than the fixed blind 22, and approximately parallel to the mask M. The movable blind 21 comprises a pair of non-scanning-direction blinds (shielding members, not shown) and a pair of scanning-direction blinds (not shown). The non-scanning-direction blinds of the movable blind 21 are movable in the non-scanning direction (X direction), perpendicular to the scanning direction (Y direction). The non-scanning-direction blinds define the linear boundary that establishes the width in the X direction of the arc-shaped illuminated region formed on the mask M, and define the linear boundary that establishes the width in the X direction of the arc-shaped static exposure region ER formed on the wafer W during scanning exposure. The scanning-direction blinds of the movable blind 21 are movable in the scanning direction (Y direction) during scanning exposure. The scanning-direction blinds limit the beam incident on the mask M from the illumination system (1, 2) as well as the beam entering the projection-optical system PO from the mask M, at the beginning and end of scanning exposure, so that the arc-shaped static exposure region ER on the wafer W does not extend outside the rectangular shot region SR. This prevents transfer of the mask pattern outside the rectangular shot region SR.

Figure 4:
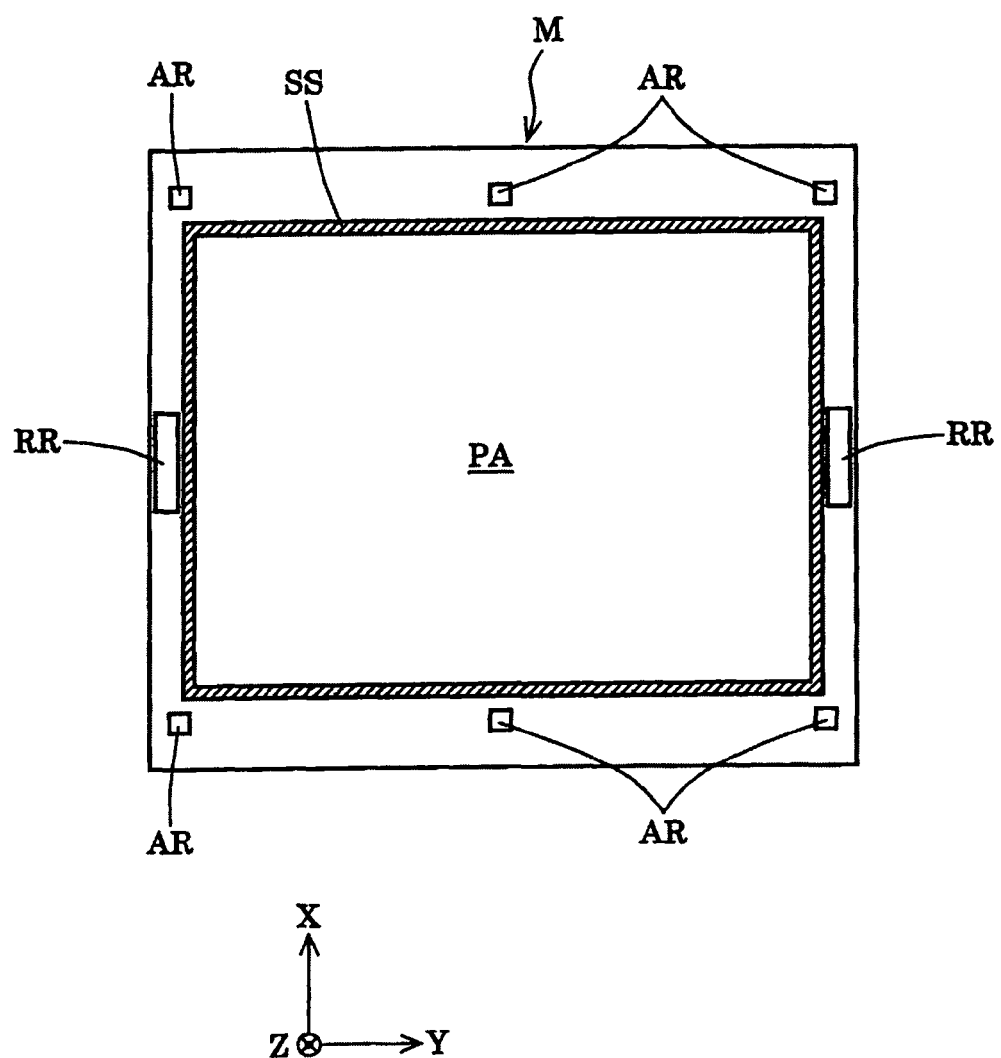
FIG. 4 is a schematic drawing showing the configuration of the reflective mask used in a first technique of an exposure-dose control process and in a second technique of an exposure-dose control process.

FIG. 4 schematically depicts certain features of an embodiment of a reflective mask. A rectangular pattern area PA, on which is formed the pattern to be transferred to the wafer W, is established in the center of the reflective mask M. A shielding strip SS, having a long, thin, band-shaped form corresponding to the four sides of a square, is established around the pattern area PA. Reference reflective surfaces RR comprise reflective structures that are configured substantially identically to the reflective surface in the pattern area PA. The reference reflective surfaces RR are situated in a region, in the scanning direction (Y direction), adjacent but outside the pattern area PA.

Specifically, the reflective surface in the pattern area PA and the reference reflective surface RR have the same configuration of multilayered films, for example. Also, multiple alignment marks AR, used for positioning (alignment) of the reflective mask M and the wafer W, are situated around and outside the pattern area PA. FIG. 4 shows an example of a pair of rectangular reference reflective surfaces RR that are adjacent in the Y direction (scanning direction) to the pattern area PA. Alternatively, various other arrangements in number, position, outer profile, size, and the like of the reference reflective surfaces RR are possible.

Returning to FIG. 1, the exposure apparatus of this embodiment comprises a first illumination sensor (generally termed "illumination sensor") 4 for detecting EUV light incident on the reflective mask M from the illumination system (1, 2). The exposure apparatus also comprises a second illumination sensor (generally termed "exposure sensor") 5 for detecting EUV light that is incident on a reference reflective surface RR from the illumination system (1, 2), that is reflected by the reference reflective surface RR, and that arrives at the image surface of the projection-optical system PO (i.e., that arrives, after reflecting from the reference reflective surface RR, at the image surface of the projection-optical system PO). The illumination sensor 4 is mounted on the lower surface of the pair of non-scanning-direction blinds of the movable blind 21, for example, and measures the intensity of EUV light incident on the mask M. The exposure sensor 5 is mounted on the wafer stage WS, for example, and measures the intensity of EUV light incident, from the illumination system (1, 2), on the reference reflective surface RR and projection-optical system PO. Measurement data from the illumination sensor 4 and measurement data from the exposure sensor 5 are supplied to the control unit 6.

Figure 5:
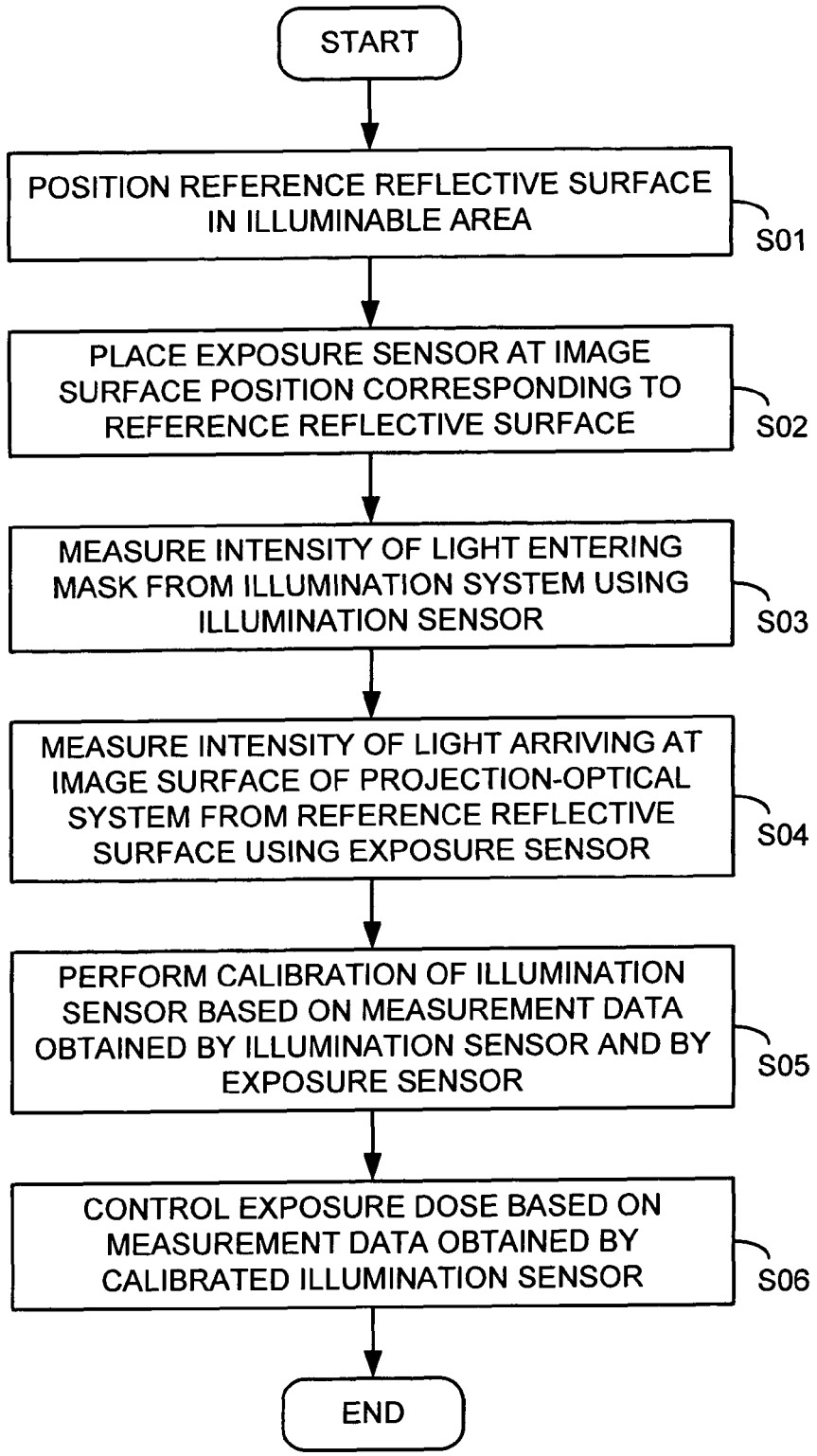
FIG. 5 is a flowchart schematically showing steps in an embodiment of the exposure method, including the method for calibrating the illumination sensor, according to the first technique.

FIG. 5 is a flowchart schematically showing the steps in an embodiment of the exposure method, which includes a method for calibrating the illumination sensor according to a first technique. In the first technique, the reference reflective surface RR on the reflective mask M is placed in an illuminable area (step S01). Specifically, the control unit 6 outputs a control signal to a mask-stage driving unit (not shown), which drives the mask stage MS in the Y direction (scanning direction) and causes the reference reflective surface RR to move to the illuminable area (area in the effective optical field of the projection-optical system PO illuminated by EUV exposure light from the illumination-optical system 2).

Next, the exposure sensor 5 is placed in the image-surface position corresponding to the reference reflective surface RR (step S02). Specifically, the control unit 6 outputs a control signal to the wafer-stage driving unit (not shown), which drives the wafer stage WS within the XY plane and causes the exposure sensor 5 to move to a position at which the EUV light, reflected by the reference reflective surface RR and passing through the projection-optical system PO, is detectable. Thus, the reference reflective surface RR is illuminated by the EUV light using the illumination-optical system 2, and the intensity of EUV light incident on the mask M from the illumination system (1, 2) is measured by the illumination sensor 4 (step S03). Meanwhile, the intensity of EUV light from the illumination system (1, 2) that is incident on the reference reflective surface RR, that is reflected by the reference reflective surface RR, and that arrives at the image surface of the projection-optical system PO is measured using the exposure sensor 5 (step S04).

Calibration (step S05) of the illumination sensor 4 is performed on the basis of measurement data (detection data) obtained by the illumination sensor 4 during the measurement (detection) step S03 and of measurement data (detection data) obtained by the exposure sensor 5 during the measurement (detection) step S04. Specifically, in the calibration step S05, the control unit 6 determines the relationship between the intensity of illumination light incident on the reflective mask M and the intensity of exposure light incident on the wafer W, based on measurement data from the illumination sensor 4 and the exposure sensor 5. The control unit 6 calibrates the illumination sensor 4 by storing data concerning this intensity relationship in a memory in the control unit 6, or the like. This acquisition of data on the intensity relationship yields a calibration of the illumination sensor 4. For example, the intensity of EUV light produced by the light source 1 is varied within a predetermined range (e.g., ±15% for each 1%), and the relationship between the light intensities as measured by the two sensors (determined from the measurement data from the illumination sensor 4 and the measurement data from the exposure sensor 5) is stored as a lookup table or function. The lookup table or function may be updated with each calibration, since the light-intensity relationship determined by the illumination sensor 4 and the exposure sensor 5 usually changes with changes in the reflectance of the mask, transmittance of the projection-optical system PO, and the like. The manner in which the measured intensity relationship from the two sensors 4, 5 is stored is not limited to this example; various other methods may be used instead.

The illumination sensor 4, which was calibrated in the calibration step S05, controls the exposure dose on the wafer W (step S06). This control is specifically based on the real-time measurement data obtained by the illumination sensor 4 that has been calibrated in steps S01-S05 (in effect, the data concerning the intensity of the illumination light as measured using the illumination sensor 4 and the data concerning the intensity relationship stored in the memory). Specifically, in the exposure-dose control step S06, the control unit 6 executes an exposure while controlling the exposure dose on the wafer W by adjusting the output intensity of the light source 1, the respective scanning velocities of the mask stage MS and wafer stage WS, the attenuation performance of the attenuation filter (item 23 in FIG. 2) in the illumination light path, and the like, based on the real-time measurement data obtained by the calibrated illumination sensor 4.

In the first technique, the reflective mask M, on which the reference reflective surface RR is established outside the pattern area PA, is used and the intensity of EUV light incident on the reflective mask M is measured using the illumination sensor 4, while the intensity of EUV light, reflected by the reference reflective surface RR and arriving at the image surface of the projection-optical system PO, is measured using the exposure sensor 5. Based on the measurement data obtained by the illumination sensor 4 and the measurement data obtained by the exposure sensor 5, the illumination sensor 4 is calibrated by determining a correspondence relationship between the measured intensity from the two sensors 4, 5. The exposure dose on the wafer W is controlled on the basis of the real-time measurement results obtained by the calibrated illumination sensor 4.

In the first technique, the reference reflective surface RR is provided on the reflective mask M. Hence, there is no significant difference between the reflectance of the patterned reflective surface of the mask M and the reflectance of the reference reflective surface RR, compared to a technique using a reference reflective surface (reference reflector) located on the mask stage. As a result, with the exposure method and apparatus according to the first technique is directed, high-precision calibration of the illumination sensor 4 is performed using the reference reflective surface RR established outside of the pattern area PA on the reflective mask M. Thus, the exposure dose on the wafer (photosensitive substrate) W can be controlled at high precision, which allows a fine pattern to be transferred with high precision to the wafer W.

In particular, using the exemplary configuration of the reflective mask M shown in FIG. 4, the reference reflective surface RR is established in a region, in the scanning direction (Y direction), adjacent but outside the pattern area PA. Hence, the reference reflective surface RR can be moved easily to an illuminable area by moving the mask stage MS in the scanning direction. Alternatively, in the first technique, various other modes are possible for the number, position, outer profile, size, and the like of the reference reflective surfaces RR established in the area outside the pattern area PA of the reflective mask M.

In a normal exposure operation, the illumination light desirably does not illuminate the periphery of the shielding strip SS. In the first technique, control of exposure dose is performed using the reference reflective surface RR established outside of the pattern area PA of the reflective mask M. With a repetition of the normal exposure operation, the difference between the intensity of integrated light irradiating the pattern area PA and the intensity of integrated light irradiating the reference reflective surface RR can increase over time. Specifically, whenever both the reflective surface in the pattern area PA and the reference reflective surface RR outside the pattern area PA are formed of multilayer film, the reflectance drops as the intensity of irradiating integrated light increases. As a result, with the first technique, whenever a normal scanning exposure operation is simply repeated, the difference in intensity of the integrated light irradiating the pattern area PA of the mask M and the intensity of integrated light irradiating the reference reflective surface RR can increase over time.

If the difference in reflectance between the reflective surface in the pattern area PA and the reference reflective surface RR increases over time, it can become impossible to correctly determine the reflectance of the mask M using the reference reflective surface RR. In such an event it may be impossible to control the exposure dose on the wafer W with sufficient precision. In the second technique the illumination sensor 4, used for detecting EUV light incident on the reflective mask M from the illumination system (1, 2), is calibrated at a still higher precision with the introduction of a new process for controlling the radiation of EUV light on the reference reflective surface RR. Thus, the intensity of integrated light irradiating the pattern area PA becomes substantially equal to the intensity of integrated light irradiating the reference reflective surface RR.

Figure 6:
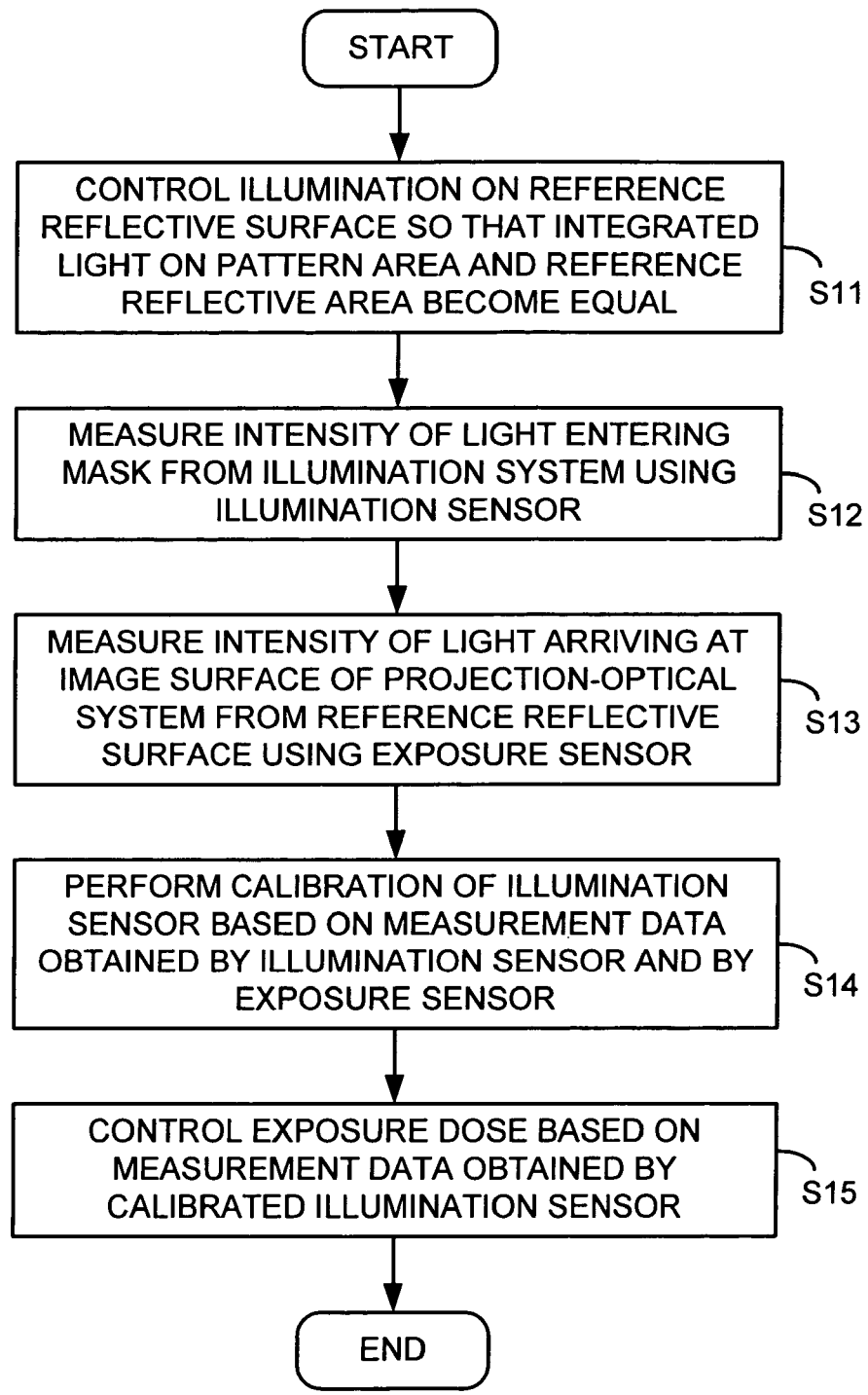
FIG. 6 is a flowchart schematically showing steps in an embodiment of the exposure method, including the method for calibrating the illumination sensor, according to the second technique.

FIG. 6 is a flowchart schematically depicting the steps in the exposure method, including calibration of the illumination sensor, according to the second technique. In the second technique, radiation of EUV light on the reference reflective surface RR is controlled so that the intensity of integrated light irradiating the pattern area PA becomes substantially equal to the intensity of integrated light irradiating the reference reflective surface RR. This is achieved by a method, using the reflective mask M, that is similar to the first technique shown in FIG. 4. Specifically, in a light-radiation-control step S11, the reference reflective surface RR is illuminated for a predetermined time by the illumination system (1, 2) during each "overhead time" (a period including the wafer-changing time, the mask and wafer alignment time, and so forth) between the end of exposure of one wafer W and the beginning of exposure of the next wafer W.

For example, the standard sensitivity of the resist used in current EUVL exposure apparatus is approximately 5 $mJ/cm^2$, and the standard light source output intensity is 10 W. Consequently, considering the transmittance of the illumination system and the projection-optical system, the intensity of illumination at the wafer surface becomes approximately 30 $mW/cm^2$. Thus, the exposure time per unit area of the wafer is approximately 0.17 seconds [=(5 $mJ/cm^2$)/(30 $mW/cm^2$)]. In the case of using a 300-mm diameter wafer, with 76 chips (dies) exposed per wafer; the total time in which the pattern area on the mask is illuminated with EUV light during exposure of the wafer is approximately 12.7 seconds [=0.17 seconds×76 chips].

Consequently, the intensity of integrated light radiated on the pattern area PA can normally be made substantially equal to the intensity of integrated light radiated on the reference reflective surface RR by radiating the EUV light on the reference reflective surface RR for 12.7 seconds, for example, each time the exposure of a wafer is ended. Currently, the wafer-changing period of an EUVL exposure apparatus (time necessary just for exchanging wafers, but not including the alignment time such as the EGA (enhanced global alignment)) is approximately 15 seconds. This overhead time is longer than the 12.7 seconds required for illuminating the reference reflective surface RR. In other words, the radiation-control step S11 can be executed without reducing the throughput of a current EUVL exposure apparatus. Moreover, in a case where the radiation of EUV light on the wafer stage via the projection-optical system may become problematic as the EUV light is radiated in the radiation-control step S11, it is desirable to configure the apparatus so that a shield can be inserted at a predetermined location on the optical path at an arbitrary time.

Next, after the radiation-control step S11, the reference reflective surface RR is moved to within the effective optical field of the projection-optical system PO. The intensity of light incident on the mask M from the illumination system (1, 2) is measured using the illumination sensor 4 (step S12). This measurement is performed while the intensity of light that is incident on the reference reflective surface RR from the illumination system (1, 2), that reflects from the reference reflective surface RR, and that arrives at the image surface of the projection-optical system PO is measured using the exposure sensor 5 (step S13).

The illumination sensor 4 is calibrated based on the measurement results (detection data) obtained by the illumination sensor in the measurement step S12 after the radiation-control step S11 and on the measurement results (detection data) obtained by the exposure sensor 5 in the measurement step S13 after the illumination-control step S11 (step S14). In the calibration step S14, the control unit 6 determines a relationship between the intensity of illumination light incident on the reflective mask M and the intensity of exposure light incident on the wafer W. This determination is based on the measurement data obtained by the illumination sensor 4 and the measurement data obtained by the exposure sensor 5. The control unit 6 references the data concerning this intensity relationship and calibrates the illumination sensor 4 accordingly. This calibration may be performed in the same way as in the first technique discussed above.

Finally (step S15), the exposure dose on the wafer W is controlled based on the real-time measurement results obtained by the illumination sensor 4 calibrated in the calibration step S14 (i.e., the illumination sensor 4 calibrated using the calibration method S11-S14 using data concerning the intensity of the illumination light measured using the illumination sensor 4, and the data (stored in a memory) concerning the intensity relationship). Specifically, in the exposure-dose control step S15, the control unit 6 controls the exposure dose on the wafer W by adjusting the output intensity of the light source 1, the respective scanning velocities of the mask stage MS and wafer stage WS, the attenuation achieved by the attenuation filter (item 23 in FIG. 2) in the illumination light path, and the like.

Hence, the control unit 6 functions as a light-radiation-control unit for controlling the intensity of EUV light incident on the reference reflective surface RR. According to this control, the intensity of integrated light irradiating the pattern area PA is substantially equal to the intensity of integrated light irradiating the reference reflective surface RR. The control unit 6 also functions as a calibration unit for calibrating the illumination sensor 4, based on measurement data obtained by the illumination sensor 4 and exposure sensor 5. Thus, the radiation of light to the reference reflective surface RR is controlled. The control unit 6 also functions as an exposure-dose control unit for controlling the exposure dose on the wafer, based on the measurement data obtained by the calibrated illumination sensor 4.

As discussed above, in the second technique, the difference in reflectance between the reflective surface in the pattern area PA and the reference reflective surface RR can be prevented from changing over time, as a result of controlling the illumination of the reference reflective surface RR. Thus, the intensity of integrated light irradiating the pattern area PA is normally made equal to the intensity of integrated light irradiating the reference reflective surface RR. As a result, in an exposure method and exposure apparatus to which the second technique is applied, the illumination sensor 4 can be calibrated to a higher precision than usually obtainable even with the first technique. This allows the exposure dose on the wafer (photosensitive substrate) W to be controlled to a higher precision than obtainable with the first technique, using the reference reflective surface RR of the reflective mask M. With the second technique, as with the first technique, various alternative modes are possible for the number, position, outer profile, size, and the like of the reference reflective surfaces RR that are established in an area outside the pattern area PA of the reflective mask M.

By illuminating the reference reflective surface RR for a predetermined time at each overhead-time period using the second technique, the intensity of integrated light irradiating the pattern area PA is maintained substantially equal to the intensity of integrated light irradiating the reference reflective surface RR. This is not intended to be limiting, however; alternative schemes are possible in which the respective intensities of integrated lights on the pattern area PA and on the reference reflective surface RR are maintained substantially equal to each other by scanning illumination of the reference reflective surface RR after each scanning exposure. Further alternatively, the respective intensities of integrated lights on the pattern area PA and on the reference reflective surface RR are maintained substantially equal to each other by a scanning illumination of the reference reflective surface RR during each scanning exposure.

Figure 7:
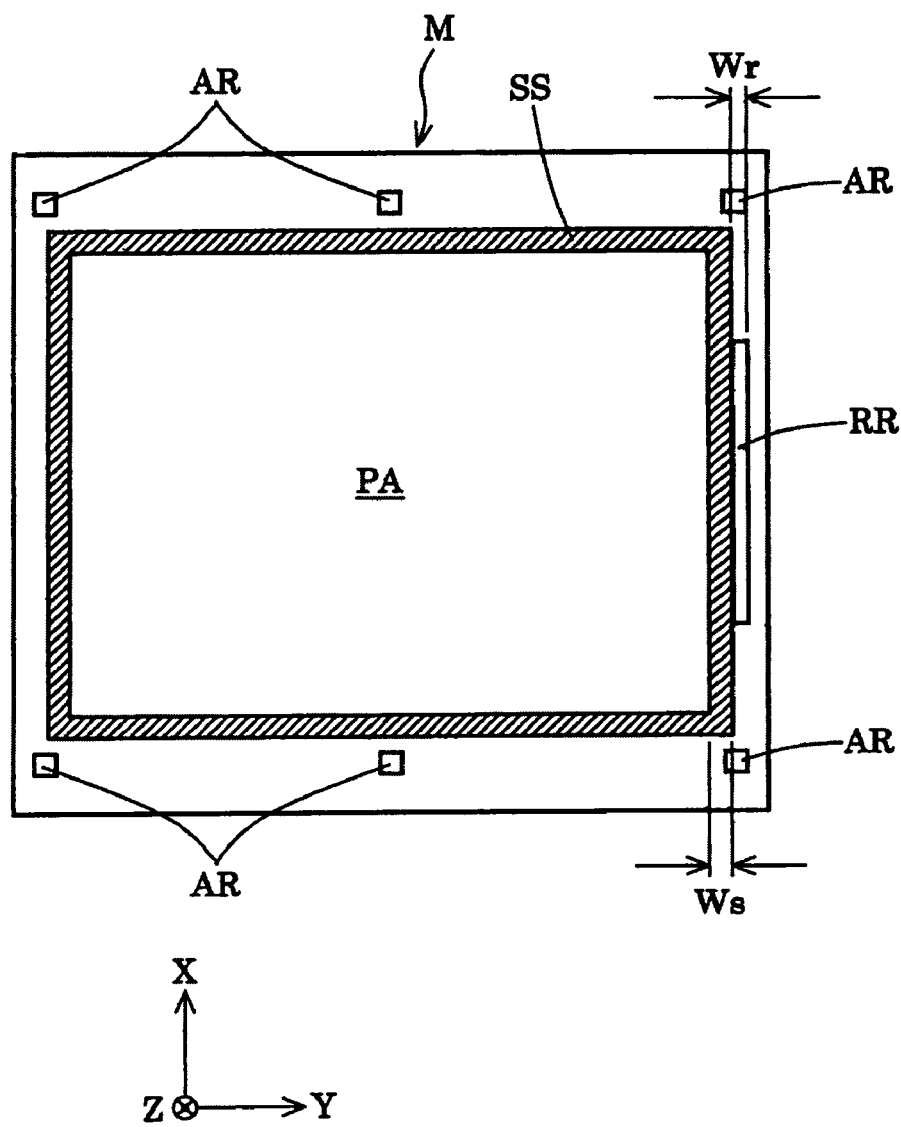
FIG. 7 is a schematic drawing showing the configuration of an embodiment of the reflective mask used in a first variant of the second technique for scanning illumination of the reference reflective surface after making a scanning exposure.

FIG. 7 schematically depicts a configuration of an embodiment of the reflective mask used in a first variant of the second technique for scanning illumination of the reference reflective surface after each scanning exposure. In the first variant the reflective mask M in FIG. 7 has a configuration similar to that shown in FIG. 4; but, the configuration in the first variant differs from FIG. 4 with regard to the establishment of one rectangular reference reflective surface RR. The reference reflective surface RR is long and narrow and extends in the X direction in an area on the +Y direction side of the pattern region PA irradiated by light. The reference reflective surface RR is a region adjacent, in the Y direction (the scanning direction), to the shielding strip SS enclosing the pattern area PA. In this first variant the reference reflective surface RR, moved in the Y direction (scanning direction), is illuminated by the illumination system (1, 2) after the end or before the beginning of the scanning exposure of the wafer W. To simplify the following description, the reference reflective surface RR is regarded as being illuminated after the end of the scanning exposure of the wafer in the case where the mask M moves in the −Y direction. As the mask M moves beyond the ending position of the scanning exposure, the movement of the mask M in the −Y direction continues for a predetermined distance to allow irradiation of the reference reflective surface.

Figure 8:
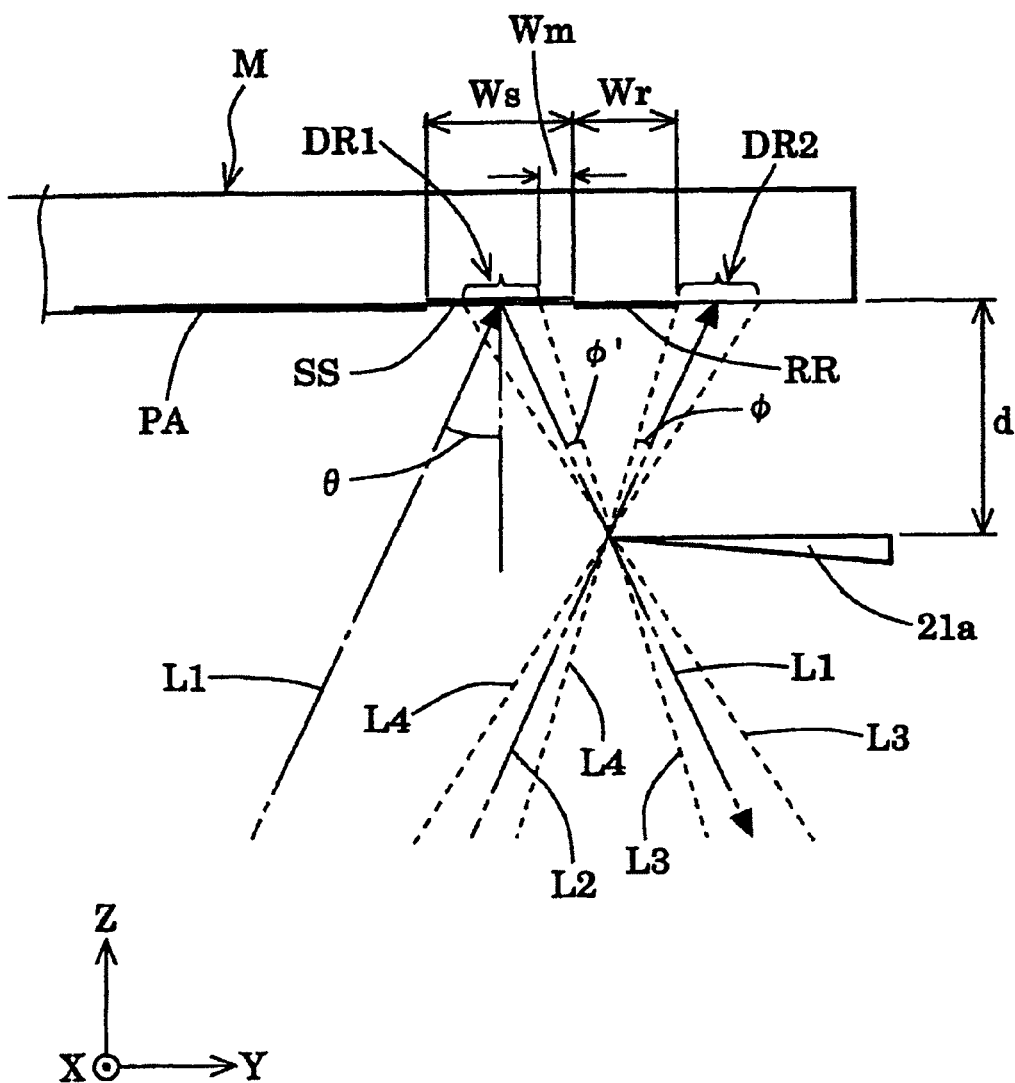
FIG. 8 is a drawing showing a usable range of the reference reflective surface in the reflective mask in FIG. 7.

FIG. 8 depicts the usable range for the reference reflective surface RR in the reflective mask in FIG. 7. In FIG. 8, the ray L1 is the chief ray that is assumed to be reflected by the shielding strip SS after impinging on the shielding strip SS at an angle of incidence θ (actually, the ray L1 is absorbed by the shielding strip SS) and to be passing across the edge of the scanning-direction blind 21a of the movable blind 21. The ray L2 is the chief ray that passes across the edge of the scanning-direction blind 21a and impinges on the mask M at the angle of incidence θ. The rays L1, L2 cross at the edge of the scanning-direction blind 21a so as to form an angle φ with the rays L1, L2. The rays L3 and L4, which are drawn with dashed lines, define the width of a blur at the pattern surface of the mask M generated by the scanning-direction blind 21a, which is placed at a distance d from the pattern surface (lower surface in the drawing) of the mask M.

The width Ws (dimension in the Y direction in FIG. 8) of the shielding strip SS is greater than the width of the blur region DR1, which is defined on the pattern surface of the mask M by a pair of marginal rays L3 that are related to the chief ray L1 reflected by the shielding strip SS and passing across the edge of the scanning-direction blind 21a. It is desirable that the configuration allow the chief ray L1 to enter the central position in the Y direction of the shielding strip SS. The angle φ formed by the chief ray L1 and marginal ray L3 and the angle φ' formed by the chief ray L2 and marginal ray L4 are expressed with the following Equations (1) and (2). In Equations (1) and (2) NA is the image-side numerical aperture of the projection-optical system PO; σ is the illumination coherence factor (image-side numerical aperture of the illumination-optical system 2 divided by the object-side numerical aperture of the projection-optical system PO); and β is the magnification ratio of the projection-optical system PO.

$$\phi = \sin^{-1}(NA \cdot \sigma \cdot \beta) \quad (1)$$

$$\phi' = \sin^{-1}(NA \cdot \beta) \quad (2)$$

In the first variant of the second technique, it is important that the pattern area PA of the mask M and the reference reflective surface RR receive illumination from the illumination system (1, 2) under the same conditions. It is also important that the beam reflected by the reference reflective surface RR after the scanning exposure not reach the wafer W. This can be achieved, for example, by blocking the beam using the scanning-direction blind 21a of the movable blind 21, thereby preventing the beam from entering the projection-optical system PO. In other words, in FIG. 8 the usable width Wr of the reference reflective surface RR in the Y direction is defined as the dimension in the Y direction of the region between the shielding strip SS and the blur region DR2, which region is defined by the pair of marginal rays L4 related to the chief ray L2 which passes across the edge of the scanning-direction blind 21 a and is incident on the mask M at the angle of incidence θ. The usable width Wr is expressed with the following Equation (3):

$$Wr = 2d(\tan\theta) - \frac{Ws}{2} - d[\tan\theta - \tan(\theta - \varphi)] \quad (3)$$

$$= d(\tan\theta) - \frac{Ws}{2} + d\tan(\theta - \varphi)$$

In a current EUVL exposure apparatus, the standard angle of incidence θ is approximately 105 mrad (milliradians), the standard image-side numerical aperture NA of the projection-optical system PO is approximately 0.26, the standard magnification ratio β of the projection-optical system PO is 1/4, the standard coherence factor σ is 0.8, the standard distance d between the scanning direction blind 21a and the pattern surface of the mask M is approximately 18 mm, and the standard width Ws of the shielding strip SS is approximately 3 mm. Consequently, the usable width Wr of the reference reflective surface RR is approximately 1.4 mm in the first variant of the second technique.

The width Wm between the blur region DR1 and the right end of the shielding strip SS in the drawing is determined by considering the displacement of the relative physical relationship between the scanning direction blind 21a and the mask M. This displacement may be caused by the movement of the mask stage or by an assembly or mounting error. Consequently, if these components have an ideal relative physical relationship, the width Wm may be eliminated and usable width Wr is maximized. In such a case, Ws=DR1, which can be expressed as follows, using Equation (2):

$$DR1 = d[\tan(\theta+\phi') - \tan(\theta-\phi')] \quad (4)$$

As a result, the maximum value of the usable width Wr of the reference reflective surface RR can be expressed using Equation (5), in which Equation (4) is substituted into Equation (3):

$$Wr = \frac{d}{2}[2\tan\theta + 2\tan(\theta - \varphi) + \tan(\theta - \varphi') - \tan(\theta + \varphi')] \quad (5)$$

In effect, the reference reflective surface RR desirably is placed within the width Wr expressed with Equation 5 from the end opposite to the pattern area of the shielding strip.

In the first variant of the second technique, the width dimension of the usable width of the reference reflective surface RR matches that of the real reference reflective surface RR in order to simplify the description. However, without being limited thereto, the reference reflective surface RR may also be formed beyond the range of usable width; in some cases, the width dimension of the reference reflective surface RR may be appropriately determined within the usable width. This is because, if the reference reflective surface RR is placed within the usable width Wr, the reference reflective surface of that width is maintained so that the intensity of integrated light irradiating the pattern area PA is substantially equal to the intensity of integrated light irradiating the reference reflective surface RR. Consequently, the calibration of the illumination sensor 4 and exposure-dose control can be performed at a high precision by using the reference reflective surface RR in that range. Generally, in the first variant of the second technique, various modes are possible for the width dimension, outer profile, position, number, and the like of the reference reflective surfaces RR.

Also, in the first variant of the second technique, the beam reflected by the reference reflective surface RR following scanning exposure is blocked by the scanning direction blind 21a of the movable blind 21. However, without being limited thereto, the beam reflected by the reference reflective surface RR following scanning exposure may also be blocked by a separate member other than the scanning-direction blind 21a in the optical path between the mask M and the projection-optical system PO. In some cases the beam may be blocked in the optical path of the projection-optical system PO. Also, in the first variant of the second technique, an example was also described in which the mask M continues to move in the −Y direction beyond the end position of the scanning exposure after the end of scanning exposure of the wafer W, while the reference reflective surface RR is subject to scanning illumination by the illumination system (1, 2). However, without being limited thereto, the same effects as scanning illumination of the reference reflective surface RR after scanning exposure can be attained in the case where the mask M begins to move in the +Y direction (movement having the same characteristics as movement for scanning exposure), from the start of the initial scanning-exposure position, before the scanning exposure of the wafer W, while the reference reflective surface RR is subject to scanning illumination. Moreover, the position at which the reference reflective surface RR is placed is desirably on the periphery of the pattern area PA at a position opposite to the side on which light is incident. It thereby becomes possible to block the beam reflected by the reference reflective surface RR with the scanning-direction blind 21a, regardless of the direction of movement of the mask stage.

Figure 9:
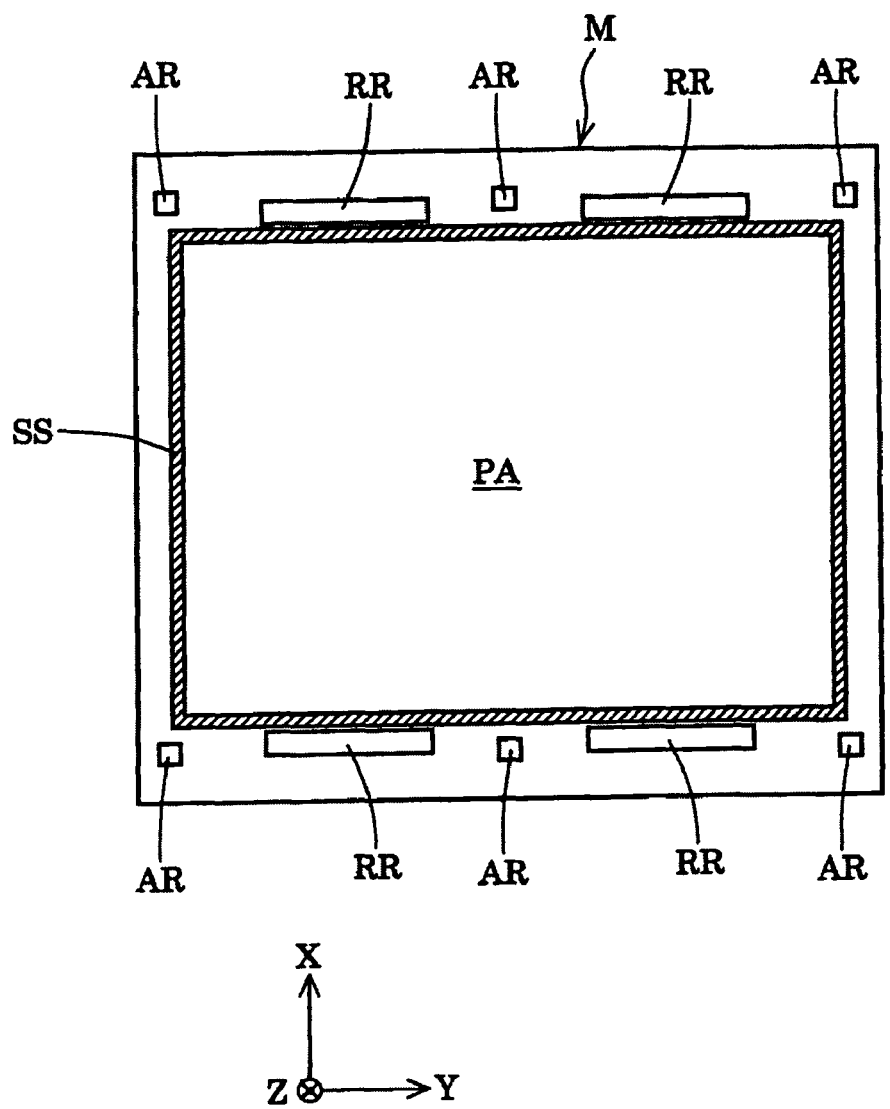
FIG. 9 is a schematic drawing showing the configuration of an embodiment of the reflective mask used in a second variant of the second technique for scanning illumination of the reference reflective surface while making a scanning exposure.

FIG. 9 schematically depicts an embodiment of the reflective mask used in a second variant of the second technique for scanning illumination of the reference reflective surface during scanning exposure. The reflective mask M in FIG. 9 has a configuration similar to the mask of FIG. 4, but differs from FIG. 4 with regard to the locations and configurations of rectangular reference reflective surfaces RR. In FIG. 9 the reference reflective surfaces RR are long and narrow and extend in the Y direction in an area outside of the pattern area PA, in regions that are adjacent in the non-scanning direction (X direction) to the pattern area PA. In the second variant of the second technique, the reference reflective surfaces RR receive scanning illumination by the illumination system (1, 2) during scanning exposure of the wafer W.

Figure 10:
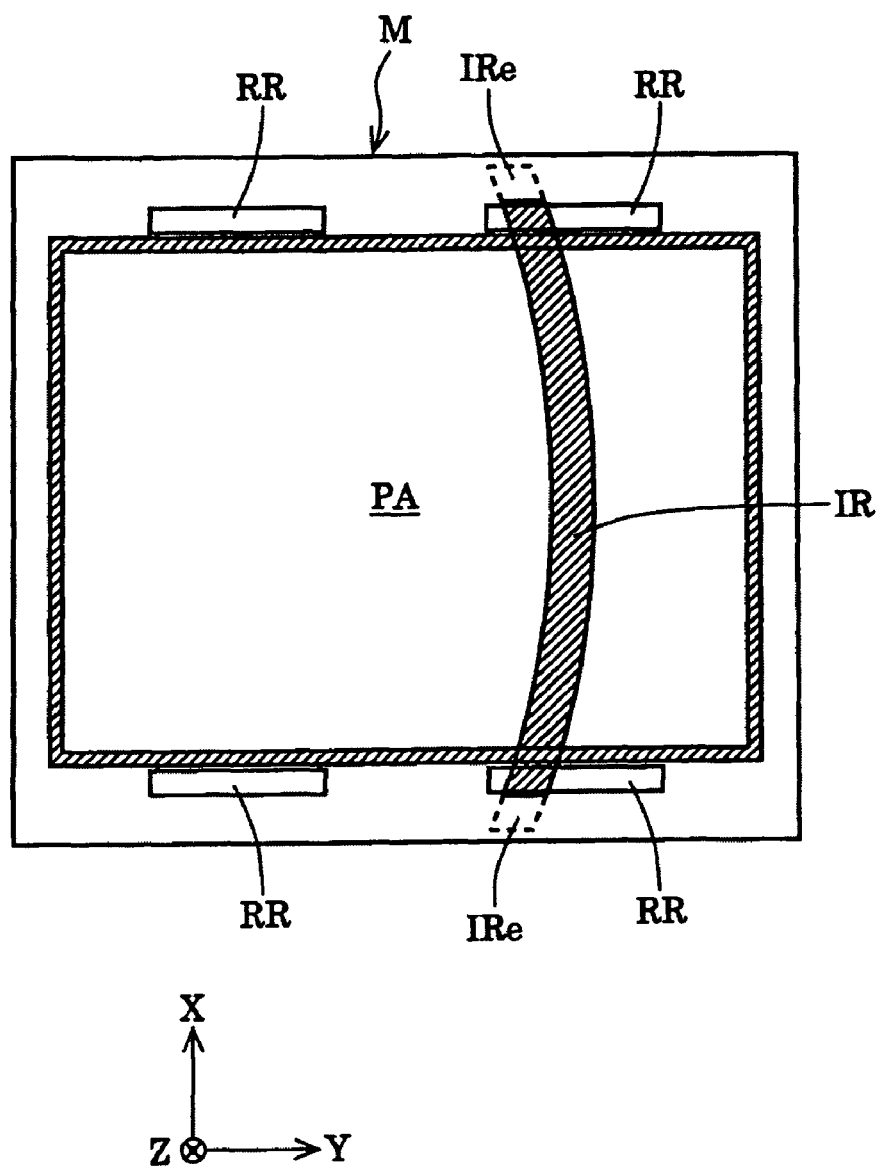
FIG. 10 is a schematic drawing showing an arc-shaped illuminated region formed on the reflective mask in FIG. 9 during a scanning exposure.

In the second variant of the second technique, as shown in FIG. 10, an arc-shaped illuminated region IR, denoted by the shaded region, is formed on the reflective mask M at the time of scanning exposure. The arc-shaped boundary of the illuminated region IR is defined by the fixed blind 22, as is the arc-shaped boundary of the static exposure region ER in FIG. 3. On the other hand, the straight boundaries determining the width of the arc-shaped illuminated region IR in the X direction are defined by a pair of non-scanning-direction blinds of the movable blind 21, so that the illuminated region IR extends over the reference reflective surfaces RR on both sides of the pattern area PA. In the regions IRe denoted with dashed lines and adjacent to both ends of the arc-shaped illuminated region IR, the beam is detected by the illumination sensors 4 mounted on the lower surface of the pair of non-scanning-direction blinds, for example. This beam does not arrive at the mask M. Of course, there may only be one illumination sensor 4.

Figure 11:
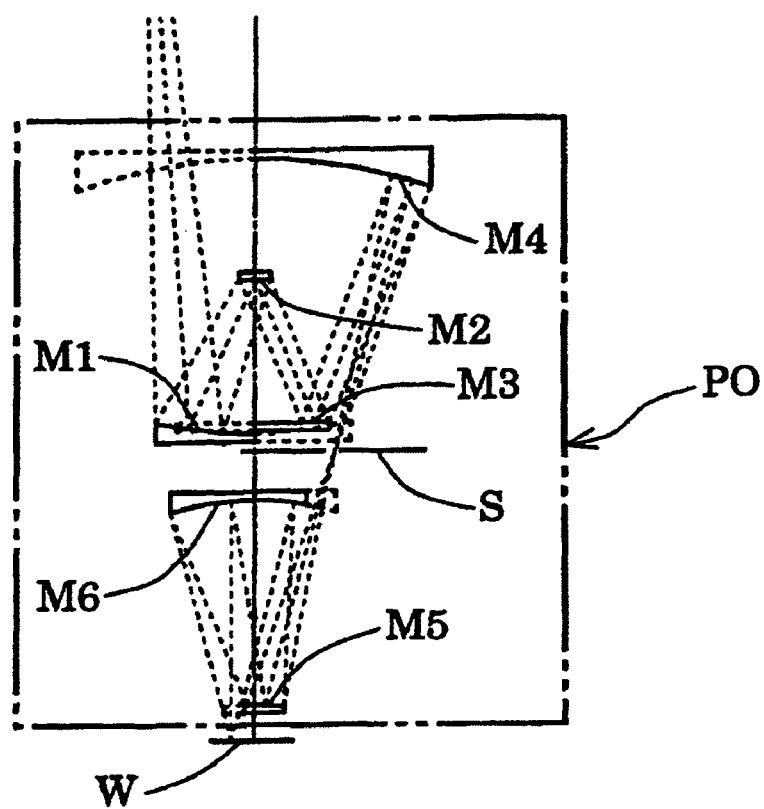
FIG. 11 is a drawing showing an obstruction of the beam reflected by the reference reflective surface of the reflective mask in FIG. 9, using a stop in the projection-optical system.
Figure 11:
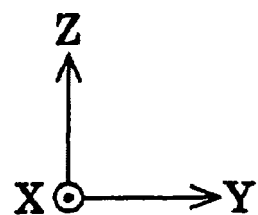

In the second variant of the second technique, it is important that the beam reflected by the region outside the pattern area PA during scanning exposure, particularly the beam reflected by the reference reflective surface RR, not arrive at the wafer W. In the second variant of the second technique, the beam reflected by the reference reflective surface RR during scanning exposure can be blocked by the stop (blind or shielding member) S placed at or in the vicinity of the intermediate image location of the projection-optical system PO, for example (FIG. 11). To simplify the description, a stop S is shown in FIG. 11 by a pair of shielding parts placed on the left and right in the drawing. In reality, however, a stop S is configured with a shielding part placed to the front and a shielding part placed to the rear relative to the surface of the page of FIG. 11.

In the second variant of the second technique, the beam reflected by the reference reflective surface RR during scanning exposure is blocked by the stop S placed at or in the vicinity of the intermediate image of the projection-optical system PO. However, without being limited thereto, the beam reflected by the reference reflective surface RR during scanning exposure may also be blocked by a separate member other than the stop S in the optical path of the projection-optical system PO, and in some cases may be blocked in the optical path between the mask M and the projection-optical system PO. Also, in the second variant of the second technique, there may be a total of four of the rectangular reference reflective surfaces RR, which are long and narrow and extend in the Y direction, on both sides of the pattern area PA. However, without being limited thereto, various modes are possible for the outer profile, position, number, and the like of the reference reflective surfaces RR in the second variant of the second technique.

In the first and second techniques discussed above, the illumination sensor 4 is calibrated, and the exposure dose on the wafer W is controlled, using a reference reflective surface RR formed outside of a shielding strip SS of the reflective mask M. However, without being limited thereto, a third technique is possible in which the illumination sensor 4 is calibrated, and the exposure dose on the wafer W is controlled, using a reference reflective surface RR formed inside a shielding strip SS of the reflective mask M.

Figure 12:
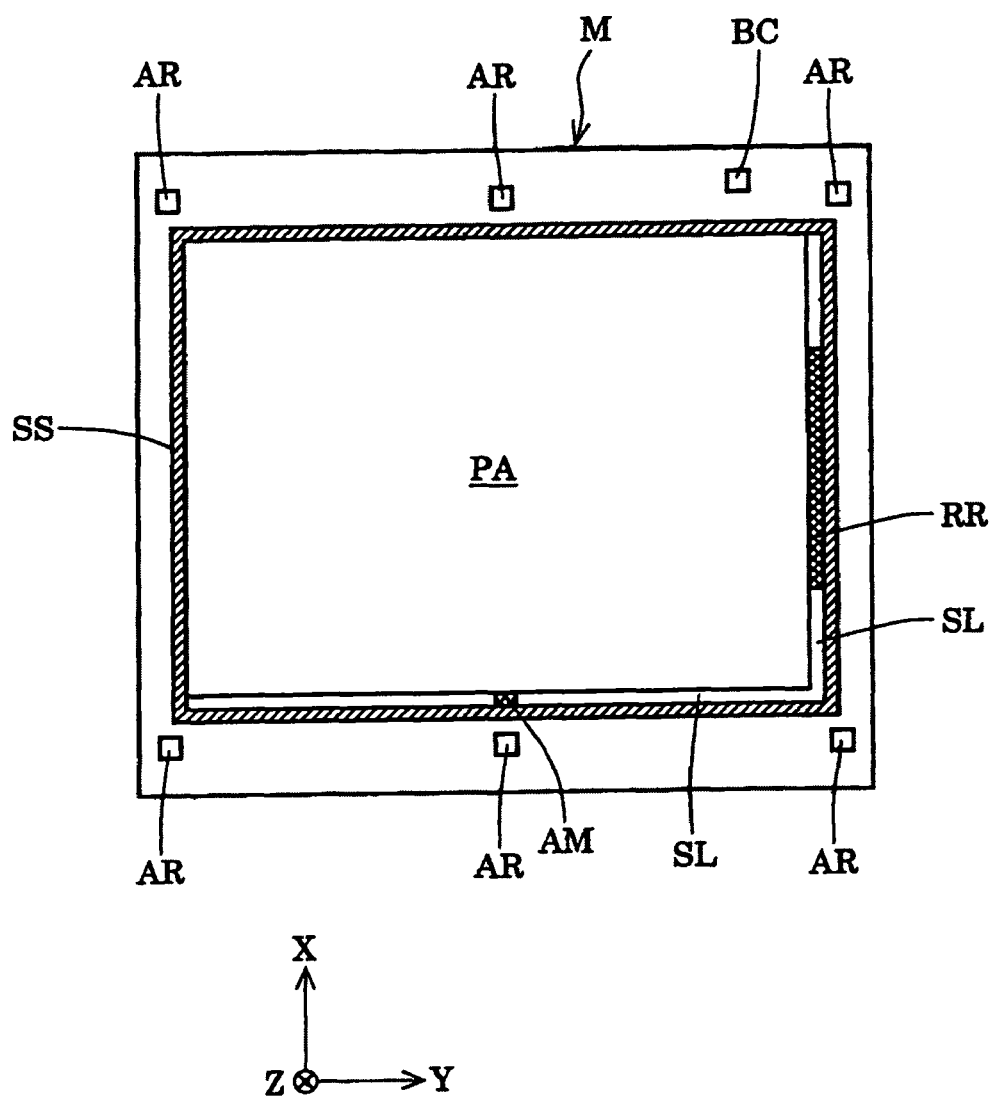
FIG. 12 is a schematic drawing of a first working example of a reflective mask used in a third technique.

FIG. 12 schematically depicts a first working example of a reflective mask used in a third technique. In the reflective mask M in FIG. 12, a reference reflective surface RR is formed on a scribe line SL situated between the pattern area PA and the shielding strip SS. The scribe line SL is a region to be transferred onto the wafer, and die cutting between chips on the wafer and so forth is performed in the transferred region, which is called a "street line." Specifically, a scribe line SL, which is long and narrow and extends in an L shape along the shielding strip SS, for example, is established in the pattern area PA of the reflective mask M. A rectangular reference reflective surface RR, which is long and narrow and extends in the X direction, is formed on the part of the scribe line SL extending in the X direction of the L-shaped scribe line SL.

In a normal exposure operation, illumination light is radiated with the entire inside of the shielding strip being under the same illumination conditions. In the third technique, the reference reflective surface RR is formed inside of the shielding strip SS of the reflective mask M. Hence, the intensity of integrated light irradiating the pattern area PA is continually maintained substantially equal to the intensity of integrated light irradiating the reference reflective surface RR by simply repeating a normal scanning-exposure operation (in some cases, a normal single-shot exposure operation). As a result, with the third technique, it is not necessary to control the illumination of the reference reflective surface RR in the same manner as in the second technique. Also, the exposure dose on the wafer W can be controlled, by performing the same process as in the first technique, at a higher precision than obtainable with the first technique (i.e., at the same precision obtained with the second technique).

In the working example shown in FIG. 12, the reference reflective surface RR is formed on the scribe line SL extending in the X direction and orthogonal to the Y direction which is the scanning direction. However, without being limited thereto, the reference reflective surface RR may also be formed on the scribe line extending in the Y direction which is the scanning direction. In this case, the effective light-receiving area of the exposure sensor 5 is small compared to when the reference reflective surface RR is formed on the scribe line SL extending in the X direction. In any event, various modes are possible for the number, position, outer profile, size, and the like of the reference reflective surfaces RR formed on the scribe line in the third technique. Also, in the working example shown in FIG. 12, the scribe line SL is placed on two edges around the four sided pattern area PA; alternatively, the scribe line can be placed on all four edges (the number is arbitrary).

Figure 13:
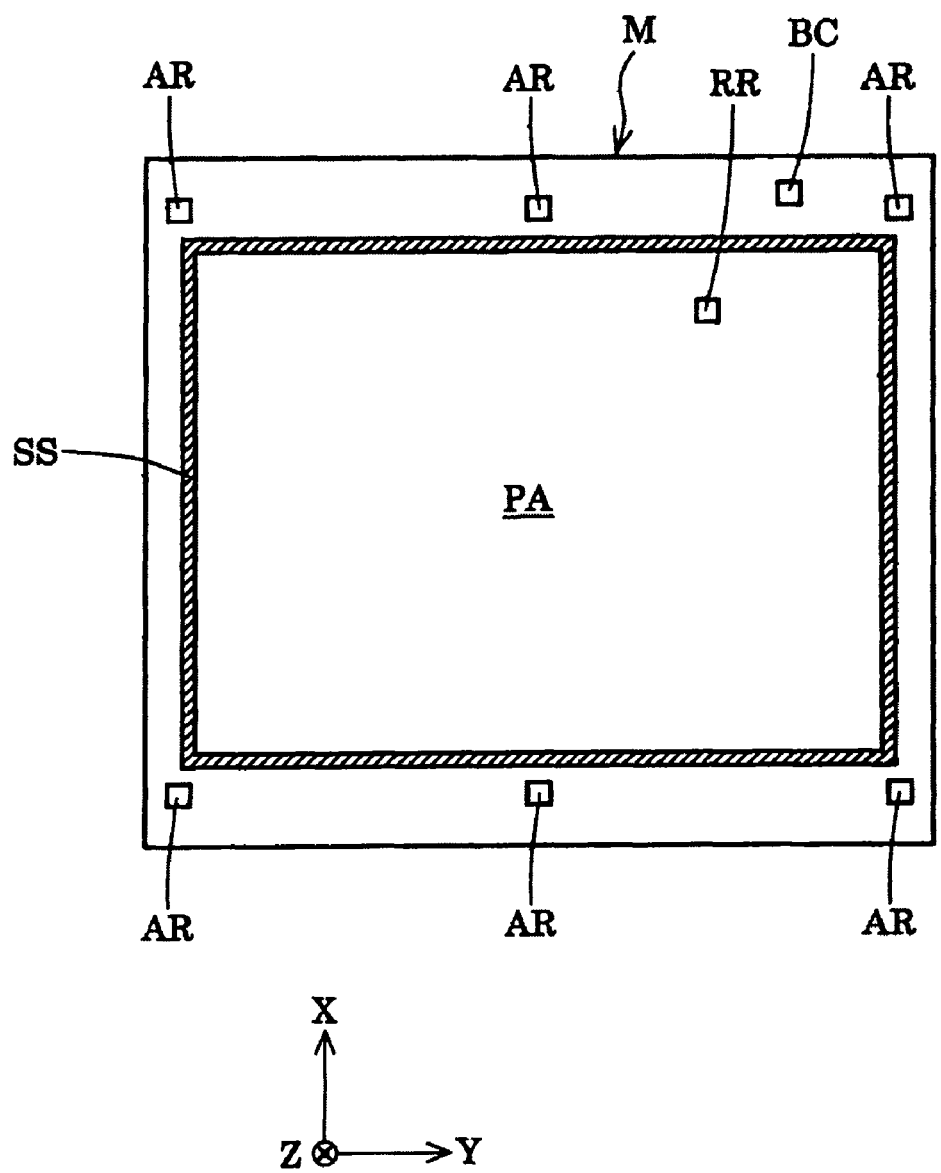
FIG. 13 is a schematic drawing of a second working example of a reflective mask used in the third technique.

FIG. 13 schematically depicts a second working example of a reflective mask M used in the third technique. In the reflective mask M in FIG. 13, the reference reflective surface RR, comprising a region in which pattern-feature bodies are not placed, is formed in the region inside the pattern area PA, i.e., inside the shielding strip SS and scribe line (not shown in FIG. 13). In this case, it is possible to ensure a reference reflective surface RR having the desired size and form, unlike the first working example in which the reference reflective surface RR is formed on the scribe line SL.

Whenever the reference reflective surface RR having the desired size and form is formed inside the pattern area PA, the area of the region in which the circuit pattern (device pattern) to be transferred can be drawn is reduced. In the second working example, various modes are possible for the number, position, outer profile, size, and the like of the reference reflective surfaces RR formed in the region inside the pattern area PA.

In the preceding description, separate reference reflective surfaces RR are placed on the mask, but in the fourth technique described below, the illumination sensor 4 is calibrated without using a reference reflective surface RR. In FIG. 12, a reference reflective surface RR, as a region where a pattern-absorber feature is not disposed, is formed on the scribe line SL. However, it is also possible to calibrate the illumination sensor 4 using a mark AM established on the scribe line extending in the Y direction, for example, instead of establishing a reference reflective surface RR. The mark AM is a pattern in a line-and-space form used for the alignment of the wafer W, for example.

In this case, information such as the position where the mark AM is formed, the percentage of reflective surface area (the percentage of the area of the reflective surface relative to the entire area of the region on which the light is incident), and the like are written to a two-dimensional barcode (matrix data) BC established outside of the pattern area PA, for example. Consequently, when using the mark AM to calibrate the illumination sensor 4, data such as the position where the AM mark is formed, the reflective surface area percentage, and the like are read optically from the two-dimensional barcode BC, and the data is input (supplied) to the control unit 6.

Based on the data relating to the position at which the mark AM is formed, the control unit 6 causes the exposure sensor 5 to move to a position where the light reflected by the mark AM and passing through the projection-optical system PO is detectable. Also, the control unit 6 calibrates the illumination sensor 4 based on the information relating to the percentage of reflective surface area of the mark AM, the measurement data obtained by the illumination sensor 4, and the measurement data obtained by the exposure sensor 5. In the fourth technique, various modes are possible for the number, position, pattern form, and the like of the mark AM used as the reference reflective surface RR and formed on the scribe line SL.

A variant of the fourth technique is described next. In this variant, the illumination sensor 4 is calibrated using light reflected by part of the circuit pattern defined in the pattern area PA. In this case, data such as the position at which the partial pattern of the mask for measurement with the exposure sensor 5 is formed, the percentage of reflective surface area (percentage of the area of the reflective surface with respect to the total area of the partial pattern region), and the like can be attained from the design data relating to the reflective mask M, for example.

In other words, in the variant of the fourth technique, when using a portion of the circuit pattern in the pattern area PA as a reference reflective surface RR, the area of the portion actually used as the reference reflective surface RR is selected based on the design data of the circuit pattern defined on the reflective mask M. From this pattern-design data, data such as the position at which the selected partial pattern is formed, the percentage of reflective surface area, and so forth are obtained. The acquired data, such as the formation position, percentage of reflective surface area, and the like, are input to the control unit 6.

Based on the data relating to the formation position, the control unit 6 causes the exposure sensor 5 to move to a position where the light reflected by the partial pattern and passing through the projection-optical system PO is detectable. Also, the control unit 6 calibrates the illumination sensor 4 based on the data relating to the percentage of reflective surface area of the partial pattern, the measurement data obtained by the illumination sensor 4, and the measurement data obtained by the exposure sensor 5. When part of the circuit pattern established in the pattern area PA is used in this example, it is desirable to use a partial pattern with as large a percentage of reflective surface area as possible (generally, the partial pattern in which the percentage of reflective surface area is equal to or greater than a predetermined value), based on design data relating to the percentage of reflective surface area of the circuit pattern. In this way, in the fourth technique, it is possible to calibrate the illumination sensor 4 using a normally placed alignment mark and circuit pattern and without the separate placement of a reference reflective surface. Hence, high-precision exposure-dose control is possible without placing a burden on reticle manufacturing. Moreover, in the fourth technique, a high-sensitivity illumination sensor is desirably used because the light-reflecting area is relatively small compared to the first through third techniques.

In the embodiments discussed above, the measurement of EUV light, including the reflectance of the reference reflective surface RR of the reflective mask M, is performed using the illumination sensor 4 and exposure sensor 5 that are included in the exposure apparatus to perform control of exposure dose. However, without being limited thereto, the reflectance of the reference reflective surface RR may be measured by and stored in a separate apparatus, with exposure-dose control being performed using the stored data. In such a case, exposure-dose variations due to factors other than the reflective mask M may be measured using the reference reflector separately placed on the mask stage, calibration of the illumination sensor 4 may be performed in advance, and control of exposure dose may be performed at the time of exposure using the stored reflectance data for the reference reflective surface RR. When done in this manner, the reference reflective surface need not be established separately.

Also, in the reflective mask M shown in FIG. 4, for example, the reference reflective surface RR extending in the X direction is formed over approximately the entire pattern area PA, and the distribution of illumination intensity in the X direction of the illuminated region illuminating the reflective mask M can be measured using this reference reflective surface RR. In other words, multiple regions separated by an interval in the X direction are assumed to be on the reference reflective surface RR. The uniformity of illumination in the X direction (direction orthogonal to the scanning direction) of the illuminated region on the reflective mask M can be confirmed by detecting, using the exposure sensor 5, the intensity of light reflected by each region and passing through the projection-optical system PO. Incidentally, in a scanning-exposure apparatus, the uniformity of illumination in the direction orthogonal to the scanning direction is more important than the uniformity of illumination in the scanning direction.

In an EUVL exposure apparatus according to the embodiments discussed above, a laser-plasma light source is used as the EUV light source. However, without being limited thereto, another appropriate light source for supplying EUV light can be used, such as a discharge-plasma light source, synchrotron radiation (SOR) light source, or the like. Also, any of various materials (solid, liquid, or the like) can be used as the target material for producing a plasma. Also, the embodiments were described above in the context of an EUVL apparatus that utilizes a reflective mask M. Alternatively, without being limited thereto, the methods and devices can be applied to other appropriate scanning-exposure apparatus that utilize reflective masks, and other appropriate single-shot exposure apparatus using reflective masks, in some cases.

Also, in the above embodiments, the illumination sensor was placed before the mask. Alternatively, the illumination sensor may be placed anywhere as long as it can detect part of the beam discharged from the light source. For example, as disclosed in Japan Patent Document Hei 09-184900-JP cited above, any configuration is acceptable in which the beam not directed toward the mask is detected and in which exposure dose on the wafer is controlled. Desirably, the illumination sensor is placed in the vicinity of the reflective mask, or in a location that is optically conjugate to the reflective mask. Also, the disclosure is not limited to the illumination-optical system and projection-optical system used in the above embodiments in which the illumination-optical system directs the beam from the light source to the mask, and the projection-optical system focuses the mask pattern on the wafer.

In the exposure apparatus according to the above embodiments, microdevices (semiconductor elements, imaging elements, liquid crystal display elements, thin film magnetic heads, and so forth) can be manufactured by illuminating a mask with an illumination system (illumination process) and exposing a transfer pattern formed on the mask to a photosensitive substrate using a projection-optical system (exposure process). An example of a technique for attaining a semiconductor device as a microdevice, by forming a predetermined circuit pattern on a wafer or the like as the photosensitive substrate using the exposure apparatus of the present embodiment, is described below with reference to the flowchart in FIG. 14.

Figure 14:
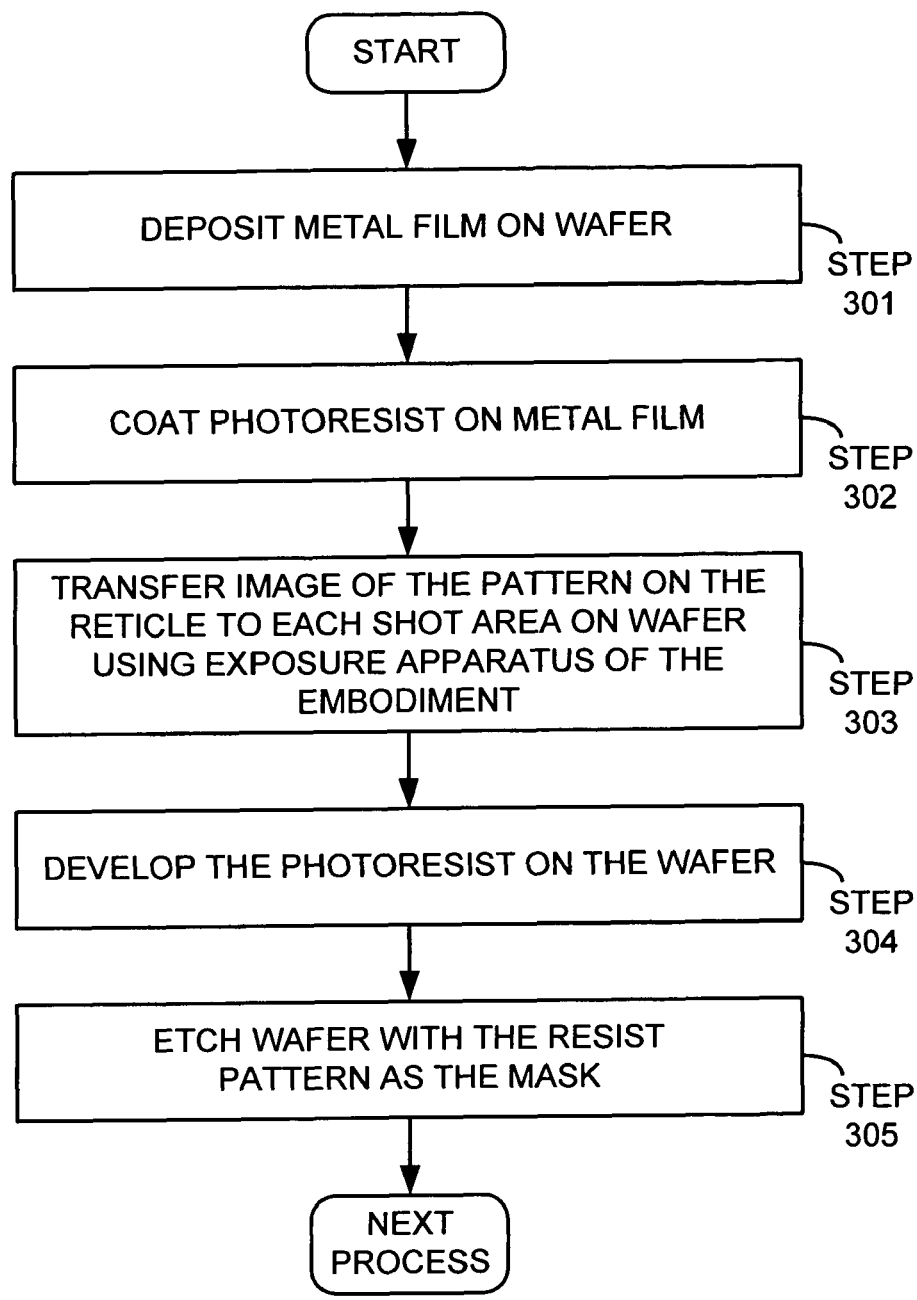
FIG. 14 is a flowchart of an example technique for fabricating a semiconductor device usable as a microdevice.

In step 301 in FIG. 14, a metal film is vapor deposited on one lot of wafers. In the next step 302, a photoresist is coated on the metal film on that one lot of wafers. Thereafter, in step 303, the image of a pattern on a mask (reticle) is sequentially exposed and transferred to each shot region on that one lot of wafers using the projection-optical system using the exposure apparatus of the present embodiment. Thereafter, in step 304 the photoresist on that lot of wafers is developed. In step 305 the circuit pattern corresponding to the mask pattern is formed on each shot region on each wafer by etching that one lot of wafers with the resist pattern as the mask. Thereafter the devices such as semiconductor elements or the like are manufactured by the formation or the like of the upper layers of the circuit pattern. With the above semiconductor-device manu-

What is claimed is:

1. In an exposure apparatus including an illumination system that directs exposure light to a reflective mask including a pattern area having a reflective surface defining a pattern, a projection-optical system that exposes the pattern on the mask onto a photosensitive substrate using the exposure light, and an illumination sensor that detects light from the illumination system that is incident on the reflective mask, a method for calibrating the illumination sensor, comprising:

using the illumination sensor, located in the vicinity of the mask downstream of an optical element that directs illumination-system light directly to the mask, detecting light from the illumination system, as incident on the mask for illuminating the pattern on the mask, thereby producing first detection data;

illuminating a reference reflective surface on the reflective mask with light from the illumination system, the reference reflective surface being located separately from the pattern area and comprising reflective structure configured substantially similarly to reflective structure of the reflective surface in the pattern area;

at an image surface of the projection-optical system, detecting light that has passed from the reference reflective surface through the projection-optical system, thereby producing second detection data; and calibrating the illumination sensor based on the first detection data and on the second detection data.

2. The method of claim 1, further comprising controlling illumination of the reference reflective surface so that integrated light illuminating the pattern on the reflective mask is substantially equal in intensity to integrated light illuminating the reference reflective surface.

3. An exposure method for exposing a pattern, defined in a pattern area on a reflective surface on a reflective mask, onto a photosensitive substrate, the method comprising:

using an illumination sensor, located in the vicinity of the mask downstream of an optical element that directs illumination-system light directly to the mask, detecting light from the illumination system that is incident on the mask for illuminating the pattern on the mask, thereby producing first detection data;

illuminating light from the illumination system on a reference reflective surface formed on the reflective mask outside the pattern area, the reference reflective surface comprising reflective structure that is configured substantially similarly to reflective structure of the reflective surface of the pattern area;

detecting light that has propagated from the reference reflective surface via a projection-optical system to an image surface of the projection-optical system, thereby producing second detection data;

calibrating the illumination sensor based on the first detection data and on the second detection data; and based on detection data obtained by the calibrated illumination sensor, controlling a dose of the exposure light that is being directed onto the photosensitive substrate.

4. The method of claim 3, further comprising controlling illumination of the reference reflective surface with light of the beam such that integrated light irradiating the pattern area of the reflective mask is substantially equal in intensity to integrated light irradiating the reference reflective surface.

5. The method of claim 4, wherein:
the reference reflective surface is situated outside the pattern area on the reflective mask; and
controlling illumination of the reference reflective surface further comprises illuminating the reference reflective surface, with light of the beam and using the illumination-optical system, during an overhead-time period between finishing exposure of one photosensitive substrate and commencing exposure of a next photosensitive substrate.

6. The method of claim 4, wherein the pattern is exposed onto the substrate by scanning exposure during which the reflective mask and the photosensitive substrate are moved in predetermined respective scanning directions.

7. The method of claim 6, wherein controlling illumination of the reference reflective surface further comprises:

using the illumination-optical system, illuminating the reference reflective surface with light of the beam while the reflective mask is moving in its predetermined respective scanning direction after finishing a scanning exposure of one photosensitive substrate or before commencing a scanning exposure of a next photosensitive substrate; and blocking light of the beam, from the illuminated reference reflective surface, from arriving at the photosensitive substrate via the projection-optical system;

wherein the illuminated reference reflective surface is situated in a region of the mask that is located (a) on a side of the mask opposite to a side on which light is incident on the mask, (b) adjacent in a predetermined direction to the pattern area, but (c) outside the pattern area.

8. The method of claim 7, wherein light of the beam from the illuminated reference reflective surface is blocked in an optical path between the reflective mask and the projection-optical system.

9. The method of claim 6, wherein controlling illumination of the reflective reference surface comprises:

using the illumination-optical system, illuminating the reference reflective surface while the reflective mask is moving in its predetermined respective scanning direction during a scanning exposure of the photosensitive substrate; and blocking light of the beam, from the illuminated reference reflective surface, from arriving at the photosensitive substrate via the projection-optical system;

wherein the illuminated reference reflective surface is situated in a region of the mask that is outside the pattern area and adjacent, in a direction orthogonal to the predetermined respective direction, to the pattern area.

10. The method of claim 9, wherein light of the beam from the illuminated reference reflective surface is blocked in an optical path of the projection-optical system.

11. The method of claim 3, wherein the illuminated reference reflective surface is located on the reflective mask on a scribe line on a periphery of the pattern area.

12. The method of claim 11, wherein:
the pattern is exposed onto the substrate by scanning exposure during which the reflective mask and the photosensitive substrate are moved in predetermined respective scanning directions; and
the illuminated reference reflective surface is located on the reflective mask on a scribe line extending in a direction orthogonal to the predetermined respective scanning direction of movement of the mask.

13. The method of claim 3, wherein the illuminated reference reflective surface is located in the pattern area of the reflective mask.

14. A device-manufacturing method, comprising:
an exposure step in which a pattern, defined on a reflective mask, is exposed onto a photosensitive substrate, the exposure step being performed using a method as recited in claim 3; and
a development step in which the photosensitive substrate is developed after the exposure step.

15. An exposure apparatus for exposing a pattern, defined in a pattern area of a reflective surface on a reflective mask, onto a photosensitive substrate, the apparatus comprising:
a source of exposure light;
an illumination system situated and configured to direct the exposure light, propagating from the source, to the pattern on the reflective mask;
a projection-optical system situated and configured to direct exposure light, propagating from the reflective mask, to the substrate;
a first illumination sensor situated in the vicinity of the mask downstream of an optical element that directs illumination-system light directly to the mask, the first illumination sensor detecting exposure light, from the illumination system, that is as incident on the reflective mask, to produce first detection data;
a second illumination sensor situated and configured to detect exposure light that has reflected from a reference reflective surface located on the reflective mask but separate from the pattern area, the reference reflective surface comprising reflective structure configured substantially similarly to reflective structure of the reflective surface of the pattern area, and that has arrived at an image surface of the projection-optical system, to produce second detection data;
a calibration unit coupled to the first and second illumination sensors so as to receive the first and second, respectively, detection data, the calibration unit being configured to calibrate the first illumination sensor based on the first and second detection data; and
an exposure-control unit coupled to the source and to the first illumination sensor, the exposure-control unit being configured to control a dose of the exposure light irradiating the photosensitive substrate based on detection data produced by the first illumination sensor as calibrated by the calibration unit.

16. The exposure apparatus of claim 15, further comprising an illumination-control unit situated and configured to control illumination of the reference reflective surface so that integrated light irradiating the pattern area of the reflective mask is substantially equal in intensity to integrated light irradiating the reference reflective surface;
the calibration unit being further configured to calibrate the first illumination sensor based on the first and second detection data as attained while intensity of illumination of the reference reflective surface is being controlled by the illumination-control unit.

17. The exposure apparatus of claim 15, further comprising:
a mask stage configured to hold and move the reflective mask; and
a substrate stage situated relative to the mask stage and configured to hold and move the photosensitive substrate;
wherein the exposure apparatus is configured to perform scanning exposure of the pattern while the mask stage and the substrate stage move in respective predetermined scanning directions.

18. The exposure apparatus of claim 17, wherein:
the reference reflective surface is situated in a region of the mask that is located (a) on a side of the mask opposite to a side on which light is incident on the mask, (b) adjacent in a predetermined direction to the pattern area, but (c) outside the pattern area;
the mask stage is configured to move the reflective mask a predetermined distance in the predetermined direction after completing, or before commencing, a scanning exposure of the photosensitive substrate; and
the apparatus further comprises a shielding unit situated so as to block light of the beam, from the illumination system and reflected from the reference reflective surface on the mask that is moving in the respective predetermined direction after completing or before commencing the scanning exposure of the photosensitive substrate, from arriving at the photosensitive substrate via the projection-optical system.

19. The exposure apparatus of claim 18, wherein the shielding unit comprises a movable blind situated between the reflective mask and the projection-optical system, the movable blind being configured to move in the predetermined respective direction of scanning motion of the mask during exposure of the pattern.

20. The exposure apparatus of claim 19, wherein:
the reference reflective surface is situated, on the mask adjacent a shielding strip surrounding the pattern area, within a usable width (Wr) in the predetermined direction of scanning movement of the mask and reference reflective surface; and
the usable width (Wr) is defined by the following equation, in which d is a distance between the reflective mask and the movable blind, θ is an angle of incidence of exposure light impinging on the reflective mask, NA is an image-side numerical aperture of the projection-optical system, σ is a coherence factor of the exposure light, and β is a magnification ratio of the projection-optical system:

$$Wr = \frac{d}{2}[2\tan\theta + 2\tan(\theta - \varphi) + \tan(\theta - \varphi') - \tan(\theta + \varphi')],$$

wherein $$\varphi = \sin^{-1}(NA \cdot \sigma \cdot \beta) \text{ and } \varphi' = \sin^{-1}(NA \cdot \beta).$$

21. The exposure apparatus of claim 17, wherein:
the reference reflective surface is situated in a region of the reflective mask that is located outside the pattern area and adjacent, in a direction orthogonal to the predetermined respective direction of motion of the mask, to the pattern area;
the illumination system is configured to illuminate the reference reflective surface of the reflective mask moving in the predetermined respective direction during scanning exposure of the photosensitive substrate; and
the apparatus further comprising a shielding unit situated and configured to block light of the beam, from the reference reflective surface illuminated during scanning exposure of the photosensitive substrate, arriving at the photosensitive substrate via the projection-optical system.

22. The exposure apparatus of claim 21, wherein the shielding unit comprises a stop placed at or in the vicinity of an intermediate-image location of the projection-optical system.

23. An exposure method for exposing a pattern, defined in a pattern area on a reflective surface of a reflective mask, onto a photosensitive substrate, the method comprising:

directing a beam of exposure light from the pattern area on the reflective mask, via a projection-optical system, onto a photosensitive substrate so as to expose the pattern onto the substrate;

using an illumination sensor, located in the vicinity of the mask downstream of an optical element that directs light from an illumination system directly to the mask, detecting illumination-system light as incident on the pattern area, thereby producing first detection data;

using light from the illumination system, illuminating a reference reflective surface formed separately from the pattern area on the reflective mask, the reference reflective surface comprising reflective structure configured substantially similarly to reflective structure of the reflective surface in the pattern area;

at an image surface of the projection-optical system, detecting light, reflected from the reference reflective surface, that has propagated from the reference reflective surface via the projection-optical system to the image surface, thereby producing second detection data; and determining a relationship between the first detection data and the second detection data.

24. The method of claim 23, further comprising storing the relationship.

25. The method of claim 23, further comprising controlling an exposure dose on the photosensitive substrate, based on the relationship.

26. The method of claim 23, further comprising controlling a dose of the exposure light on the photosensitive substrate based on the first and second data.

27. The method of claim 26, wherein the dose of the exposure light on the photosensitive substrate is controlled at least by controlling intensity of the beam of illumination light.

28. The method of claim 26, wherein the dose of the exposure light on the photosensitive substrate is controlled at least by controlling respective scanning velocities of the mask and substrate during exposure of the pattern onto the photosensitive substrate.

29. The method of claim 23, wherein light from the illumination system is detected (a) without exposing the photosensitive substrate and (b) during exposure of the photosensitive substrate.

30. The method of claim 23, further comprising controlling illumination of the reference reflective surface such that integrated light irradiating the pattern area on the reflective mask is substantially equal in intensity to integrated light irradiating the reference reflective surface.

31. An exposure apparatus for exposing a pattern, defined in a pattern area on a reflective mask, onto a photosensitive substrate, the apparatus comprising:

a source of illumination light;

an illumination system situated and configured to direct the illumination light from the source to the pattern on the reflective mask;

a projection-optical system situated and configured to direct exposure light from the reflective mask to the substrate;

a first illumination sensor, situated in the vicinity of the mask downstream of an optical element that directs illumination-system light directly to the mask, to detect light from the illumination system as incident on the reflective mask and to produce first detection data from the detected light;

a second illumination sensor situated at an image surface of the projection-optical system and configured (a) to detect light from the illumination system, that has reflected from a reference reflective surface on the reflective mask outside the pattern area and that comprises reflective structure configured substantially similarly to reflective structure of the reflective surface in the pattern area, and that has arrived at the image surface, and (b) to produce second detection data from the detected light; and a controller coupled to receive the first and second detection data and configured to determine a relationship between the first detection data and the second detection data.

32. The apparatus of claim 31, wherein the controller is further configured to control a dose of the exposure light on the photosensitive substrate, based on the relationship.

33. The apparatus of claim 31, wherein the controller is further configured to control an intensity of the illumination light so as to control a dose of the exposure light on the photosensitive substrate.

34. The apparatus of claim 31, wherein:

the reflective mask is mounted on a mask stage that is movable at a respective scanning velocity during exposure;

the photosensitive substrate is mounted on a wafer stage that is movable at a respective scanning velocity during exposure; and the controller is configured to control the respective scanning velocities of the mask stage and wafer stage so as to control a dose of the exposure light on the photosensitive substrate.

35. The apparatus of claim 31, further comprising a storage device coupled to the controller and configured to store the relationship.

36. The apparatus of claim 31, further comprising a controller coupled to the first illumination sensor, the controller being configured to receive the first detection data from the first illumination sensor during a time in which the substrate is being exposed with the exposure light and during a time in which the substrate is not being exposed.

* * * * *